(12) United States Patent
Tokito et al.

(10) Patent No.: US 7,250,226 B2
(45) Date of Patent: Jul. 31, 2007

(54) PHOSPHORESCENT COMPOUND, A PHOSPHORESCENT COMPOSITION AND AN ORGANIC LIGHT-EMITTING DEVICE

(75) Inventors: Shizuo Tokito, Tokyo (JP); Mitsunori Suzuki, Tokyo (JP); Isao Tanaka, Tokyo (JP); Youji Inoue, Tokyo (JP); Koro Shirane, Chiba (JP); Masataka Takeuchi, Chiba (JP); Naoko Ito, Chiba (JP)

(73) Assignees: Nippon Hoso Kyokai, Tokyo (JP); Showa Denko K.K., Tokyo (JP)

( * ) Notice: Subject to any disclaimer, the term of this patent is extended or adjusted under 35 U.S.C. 154(b) by 70 days.

(21) Appl. No.: 10/231,060

(22) Filed: Aug. 30, 2002

(65) Prior Publication Data

US 2003/0091862 A1 May 15, 2003

Related U.S. Application Data

(60) Provisional application No. 60/392,628, filed on Jul. 1, 2002.

(30) Foreign Application Priority Data

| Aug. 31, 2001 | (JP) | ........................ 2001-265033 |
| Mar. 20, 2002 | (JP) | ........................ 2002-079129 |
| Apr. 15, 2002 | (JP) | ........................ 2002-112352 |

(51) Int. Cl.
  *H01J 1/62* (2006.01)
  *C09L 11/06* (2006.01)

(52) U.S. Cl. ................ 428/690; 428/917; 313/504; 313/506; 252/301.16; 252/301.35; 257/40; 257/88; 257/89; 257/98

(58) Field of Classification Search ........... 428/690, 428/917; 313/504, 506; 252/301.16, 301.35; 257/40, 88, 90, 98, 89
See application file for complete search history.

(56) References Cited

U.S. PATENT DOCUMENTS

| 4,853,380 A | * | 8/1989 | Schwartz ................ 514/184 |
| 5,272,238 A | | 12/1993 | Garnier et al. |
| 5,891,975 A | | 4/1999 | Chen et al. |

(Continued)

FOREIGN PATENT DOCUMENTS

| CN | 1140725 A | 1/1997 |
| EP | 0 612 722 A1 | 8/1994 |
| EP | 0 735 055 A2 | 10/1996 |

(Continued)

OTHER PUBLICATIONS

C. L. Lee et al., "Polymer Electrophosphorescent Debvices: Comparison of Phosphorescent Dye Doped and Coordinated Systems", ICPOP '01, pp. 92–93 (Aug. 2001).
C.L. Lee et al.; "Polymer Electrophosphorescent Devices: Comparison of Phosphorescent Dye Doped and Coordinated Systems", ICPOP '01, pp. 92–93 (Aug. 2001).
Robert A. Cipriano et al.; Co–ordination Chemistry of Higher Oxidation States. Part 27. Synthesis, Properties, and Electrochemistry of some cis–Tetrahalogenoiridium (IV) Complexes: Crystal Structure of [Ir(phen)Cl$_4$], J. Chem. Soc. Dalton Trans., pp. 2483–2490 (1988).

(Continued)

*Primary Examiner*—Rena Dye
*Assistant Examiner*—Camie S Thompson
(74) *Attorney, Agent, or Firm*—Sughrue Mion, PLLC

(57) ABSTRACT

An organic polymeric phosphorescent compound and an organic light-emitting device employing the organic polymeric phosphorescent compound. The phosphorescent compound is a neutral organic polymeric phosphorescent compound emitting phosphorescence and used in an organic light-emitting device, and includes a phosphorescent unit and a carrier transporting unit.

27 Claims, 3 Drawing Sheets

U.S. PATENT DOCUMENTS

| | | | |
|---|---|---|---|
| 6,114,463 | A | 9/2000 | Chen et al. |
| 6,485,884 | B2 * | 11/2002 | Wolk et al. .................. 430/200 |
| 6,565,994 | B2 * | 5/2003 | Igarashi ...................... 428/690 |
| 6,696,180 | B2 * | 2/2004 | Doi et al. .................... 428/690 |
| 6,869,693 | B2 * | 3/2005 | Fryd et al. ................... 428/690 |
| 2001/0015432 | A1 | 8/2001 | Igarashi |
| 2001/0019782 | A1 * | 9/2001 | Igarashi et al. ............. 428/690 |
| 2002/0048689 | A1 * | 4/2002 | Igarashi et al. ............. 428/690 |
| 2002/0193532 | A1 | 12/2002 | Ikehira et al. |

FOREIGN PATENT DOCUMENTS

| | | |
|---|---|---|
| EP | 0 825 207 A2 | 2/1998 |
| EP | 0 850 960 A1 | 7/1998 |
| JP | 2-15595 | 1/1990 |
| JP | 5-121172 | 5/1993 |
| JP | 06-283268 | 10/1994 |
| JP | 8-20614 | 1/1996 |
| JP | 8-48726 | 2/1996 |
| JP | 8-157575 | 6/1996 |
| JP | 8-157815 | 6/1996 |
| JP | 8-269138 | 10/1996 |
| JP | 10-1665 | 1/1998 |
| JP | 10-101738 | 4/1998 |
| JP | 11-74077 | 3/1999 |
| JP | 2000-239318 | 9/2000 |
| JP | 2001-131542 | 5/2001 |
| JP | 2001-151868 | 6/2001 |
| JP | 2001-181616 | 7/2001 |
| JP | 2001-181617 | 7/2001 |
| JP | 2001-220579 | 8/2001 |
| JP | 2002-56975 | 2/2002 |
| JP | 2002-293830 | 10/2002 |
| JP | 2002-293930 | 10/2002 |
| JP | 2003-113246 | 4/2003 |
| JP | 2003-119179 | 4/2003 |
| JP | 2003-147021 | 5/2003 |
| JP | 2003-171393 | 6/2003 |
| JP | 2003-206320 | 7/2003 |
| JP | 2003-277444 | 10/2003 |

OTHER PUBLICATIONS

Lamberto Malatesta et al.; "(Alkoxycarbonyl)iridium Compounds with N–Donor Bases and with Tri–phenylphospine", J. Chem. Soc. (A), pp. 1836–1839 (1970).

Jen Rong Lee et al.; "Emission studies of hetero–bischelated iridium(III)–diimine complexes", Inorganica Chimica Acta, vol. 319, pp. 83–89 (2001).

L. Edman et al.; "Single–component light–emitting electrochemcial cell with improved stability"; Applied Physics Letters, vol. 82, No. 22, pp. 3961–3963 (Jun. 2, 2003).

Ullrich Mitschke et al.; "The electroluminescence of organic materials", J. Mater. Chem., vol. 10, pp. 1471–1507 (2000).

Aiping Wu et al.; "Light emitting electrochemical devices from sequentially absorbed multilayers of a polymeric ruthenium (II) complex and various polyanious", Thin Solid Films, vol. 327–329, pp. 663–667 (1998).

Chihaya Adachi et al.; "High–efficiency organic eletrophosphorescent devices with tris(2–phenylpyridine)iridium doped onto electron–transporting materials", Applied Physics Letters, vol. 77, No. 6, pp. 904–906 (Aug. 2000).

Jengping Lin et al.; "Effects of Nitride Lightly–Doped–Drain Spacers on Inter–Metal–Dietectrics–Induced Metal Oxide Semiconductor Field Effect Transistor Degradation under Hot Carrier Stress", Jpn. J. Appl. Phys., vol. 39, pp. L28–L30 (2000).

Wai Kin Chan et al.; "Synthesis and Electronic Properties of Conjugated Polymers Based on Rhenium or Ruthenium Dipyridophenazine Complexes"; J. Mater. Chem., vol. 9, pp. 2103–2108 (1999).

Sergey Lamansky et al.; "Synthesis and Charaterization of Phosphorescent Cyclometalated Irdium Complexes", Inorganic Chemistry, vol. 40, No. 7, pp. 1704–1711 (2001).

M. Suzuki et al.; "Light–emission Characteristics of Polymer Light–emitting Devices based on Biopolar Phospherescent Polymers", Abstract of the $64^{th}$ Academic Lecture of the Japan Society of Applied Physics, Lecture No. 31a–YL–7, p. 1197 (Aug. 2003).

* cited by examiner (A)

(B)

(C)

(D)

◯ : PHOSPHORESCENT SITE

▭ : CARRIER TRANSPORTING SITE (A)

(B)

(C)

PHOSPHORESCENT COMPOUND, A PHOSPHORESCENT COMPOSITION AND AN ORGANIC LIGHT-EMITTING DEVICE

This application is an application filed under 35 U.S.C. §111(a) claiming pursuant to 35 U.S.C. §119(e) the filing date of Provisional Application 60/392,628 on Jul. 1, 2002, pursuant to 35 U.S.C. §111(b).

TECHNICAL FIELD

The present invention relates to an organic polymeric phosphorescent compound used as a material for an organic light-emitting device, a phosphorescent composition, an organic light-emitting device, and a display apparatus.

BACKGROUND ART

For a display apparatus such as a flat panel display or a lighting fixture such as a back light, an organic light-emitting device emitting an electro-luminescence from a thin film made from an organic compound has been noted as a device by which a bright luminescence can be obtained at a low voltage.

Research and development for an increase in surface area employing a luminescent organic polymer soluble in an organic solvent or water are performed actively with respect to a styrene-based and a fluorene-based organic polymer as a material of a film in an organic light-emitting device. As a method for forming a film of such an organic polymer, a wet process such as a spin-coating method, a printing method, and an ink-jet method have been utilized. In particular, the ink-jet method is envisaged as a realistic method for creating pixels of a display screen in a full color display and a compact full-color prototype panel has already been disclosed.

On the other hand, research for great improvement of emission efficiency with respect to low-molecular compounds of which a film is formed by a vacuum deposition method has been performed actively and an organometallic compound with platinum or iridium, utilizing phosphorescence that is an emission from a triplet excited state of an organic compound, has been reported. An external emission quantum yield for an organic light-emitting device utilizing this phosphorescent compound exceeds 5% for a conventional device utilizing fluorescence and a high efficiency of 8% was obtained recently, and even a very high efficiency of 15% has been obtained by devising a structure of a device (Appl. Phys. Lett., 77, 904 (2000)).

There is a research report for a dope-type organic polymer light-emitting device in which this low-molecular phosphorescent compound is dispersed into an organic polymer, and for such a device that an iridium complex is doped into poly(N-vinylcarbazole) (PVK), the value of approximately 4% was obtained as an external emission quantum yield and a large improvement is appreciated (Jpn. J. Appl. Phys, 39, L28 (2000)). Also, for an organic polymer containing a ruthenium complex, an electrochemical luminescence was reported (J. Mater. Chem., 9, 2103 (1999)).

However, a conventional organic polymer light-emitting device, for which it is intended to realize an increase in surface area at low cost, has not been sufficient in respect to emission efficiency. The cause is that the theoretical external emission efficiency has an upper limit of 5% since fluorescence that is luminescence from a singlet excited state of a conventional organic polymer is utilized. Although an organic polymer light-emitting device has a major feature in that a film of an organic polymer layer can be formed from a solution in an organic solvent or water by a wet process, further improvement of emission efficiency is a problem for practice in the future.

Also, gaining great improvement of emission efficiency has been tried by dispersing a low-molecular phosphorescent compound into an organic polymer light-emitting device, but the low-molecular one dispersed into a host polymer is not stable and a display apparatus with a long service life and a reliability over a long period cannot be realized.

Therefore, taking the future realization of an organic light-emitting device into consideration, development of a novel organic polymeric luminescent material is desired, of which a film is formed from a solution in an organic solvent or water by a wet process, thereby an increase in surface area can be realized at low cost, which is stable, that is, has a long service life, and for which very highly efficient emission can be realized.

DISCLOSURE OF INVENTION

The present invention is provided taking the above problems into consideration and is directed at providing an organic polymeric phosphorescent compound and a phosphorescent composition that are stable and emit very highly efficient phosphorescence, to be used as a material of an organic light-emitting device.

Also, the present invention is directed at providing an organic light-emitting device employing the organic polymeric phosphorescent compound or the phosphorescent composition and an display apparatus employing this organic light-emitting device.

To achieve this object, the invention as claimed in claim 1 is a neutral organic polymeric phosphorescent compound emitting phosphorescence and used in an organic light-emitting device, characterized in that a phosphorescent unit being a repeat unit for emitting phosphorescence and a carrier transporting unit being a repeat unit for transporting a carrier are included.

According to the present invention in a first embodiment (1), an organic polymeric phosphorescent compound which is stable and emits very highly efficient phosphorescence, used as a material of an organic light-emitting device, can be provided, since the neutral organic phosphorescent compound emitting phosphorescence and used in an organic light-emitting device includes the phosphorescent unit being a repeat unit for emitting phosphorescence and the carrier transporting unit being a repeat unit for transporting a carrier.

The invention in a preferred embodiment (2) is characterized in that the repeat number m for the phosphorescent unit(s) and the repeat number n for the carrier transporting unit(s) satisfy the relationship of m<n in the phosphorescent compound as described in (1) above.

According to the invention as described in (2) above, emission efficiency of phosphorescence can be improved, since the repeat number m for the phosphorescent unit(s) and the repeat number n for the carrier transporting unit(s) satisfy the relationship of m<n.

The invention in a preferred embodiment (3) is characterized in that the repeat number m for the phosphorescent unit(s) and the repeat number n for the carrier transporting unit(s) satisfy the relationship of $0.0001 \leq m/(m+n) \leq 0.2$ in the phosphorescent compound as described in (2) above.

According to the invention as described in (3) above, phosphorescence can be emitted more efficiently, since the repeat number m for the phosphorescent unit(s) and the repeat number n for the carrier transporting unit(s) satisfy the relationship of $0.001 \leq m(m+n) \leq 0.2$.

The invention in a preferred embodiment (4) is characterized in that the phosphorescent compound is soluble in an organic solvent or water in the phosphorescent compound as described in (1) above.

According to the invention as described in (4) above, a film formation is allowed from a solution by means of a wet process since the phosphorescent compound is soluble in the organic solvent or water.

The invention in a preferred embodiment (5) is characterized in that a degree of polymerization for the phosphorescent compound is 5 through 5000 in the phosphorescent compound as described in (1) above.

According to the invention as described in (5) above, the phosphorescent compound is soluble in an organic solvent and a uniform and stable film can be formed, since the degree of polymerization for the phosphorescent compound is 5 through 5000.

The invention in a preferred embodiment (6) is characterized in that a phosphorescent site of the phosphorescent unit and/or a carrier transporting site of the carrier transporting unit form(s) a side chain or side chains of the phosphorescent compound in the phosphorescent compound as described in (1) above.

According to the invention as described in (6) above, a phosphorescent compound being easy to synthesize and easy to dissolve in a organic solvent can be provided, since the phosphorescent site of the phosphorescent unit and/or the carrier transporting site of the carrier transporting unit form(s) the side chain or side chains of the phosphorescent compound.

The invention in a preferred embodiment (7) is characterized in that a phosphorescent site of the phosphorescent unit and/or a carrier transporting site of the carrier transporting unit form(s) a main chain of the phosphorescent compound in the phosphorescent compound as described in (1) above.

According to the invention as described in (7) above, motion of a complex-portion is suppressed and a stable phosphorescent compound can be obtained even at high temperature, since the phosphorescent site of the phosphorescent unit and/or the carrier transporting site of the carrier transporting unit form(s) the main chain of the phosphorescent compound.

The invention in a preferred embodiment (8) is characterized in that a carrier transporting site of the carrier transporting unit is a hole transporting site in the phosphorescent compound as described in (1) above.

According to the invention as described in (8) above, a phosphorescent compound of which carrier balance is acceptable and emission efficiency is high can be obtained by changing a ratio of the hole transporting site to the phosphorescent site since the carrier transporting site of the carrier transporting unit is the hole transporting site.

The invention in a preferred embodiment (9) is characterized in that a carrier transporting site of the carrier transporting unit is an electron transporting site in the phosphorescent compound as described in (1) above.

According to the invention as described in (9) above, a phosphorescent compound of which carrier balance is acceptable and emission efficiency is high can be obtained by changing a ratio of the electron transporting site to the phosphorescent site, since the carrier transporting site of the carrier transporting unit is the electron transportin site.

The invention in a preferred embodiment (10) is characterized in that carrier transporting sites of the carrier transporting units include a hole transporting site and an electron transporting site in the phosphorescent compound as described in (1) above.

According to the invention as described in (10) above, all functions of emissive property, hole transporting property, and electron transporting property are possessed and thermal stability and a long service life are provided without compounding another organic material, since the carrier transporting sites of the carrier transporting units include the hole transporting site and the electron transporting site.

The invention in a preferred embodiment (11) is characterized in that a phosphorescent site of the phosphorescent unit is a monovalent group or divalent group of a complex with a transition metal or a rare earth metal in the phosphorescent compound as described in (1) above.

According to the invention as described in (11) above, a phosphorescent site in which emission efficiency of phosphorescence is high can be provided, since the phosphorescent site of the phosphorescent unit is the monovalent group or the divalent group of the complex with the transition metal or the rare earth metal.

The invention in a preferred embodiment (12) is characterized in that the monovalent group of the complex with the transition metal or the rare earth metal bonds, as a side chain through a spacer portion, to a main chain and the spacer portion includes an organic group in which the number of carbons is 1 through 30 and a hetero atom may be contained or an inorganic group in which the number of hetero atoms is 1 through 10 and a carbon atom is not contained in the phosphorescent compound as described in (11) above.

According to the invention as described in (12) above, a stable and high emission efficiency can be obtained by increasing a degree of freedom for motion of the complex-portion, increasing solubility into an organic solvent, and allowing a uniform thin film to be fabricated by means of a coating method since the monovalent group of the complex with the transition metal or the rare earth metal bonds, as a side chain through a spacer portion, to a main chain and the spacer portion includes an organic group in which the number of carbons is 1 through 30 and a hetero atom may be contained or an inorganic group in which the number of hetero atoms is 1 through 10 and a carbon atom is not containied.

The invention in a preferred embodiment (13) is characterized in that a carrier transporting site of the carrier transporting unit includes at least one kind of groups selected from the group of groups including monovalent groups of carbazole, monovalent groups of tertiary amine, monovalent groups of imidazole derivatives, monovalent groups of triazole derivatives, monovalent groups of oxadiazole derivatives, divalent groups of styrene, and divalent groups of fluorene and the group of groups in which the groups are substituted with a substituent in the phosphorescent compound as described in (1) above.

According to the invention as described in (13) above, a carrier transporting site in which a carrier transporting property is high can be provided, since the carrier transporting unit includes a least one kind of groups selected from the group of groups including monovalent groups of carbazole, monovalent groups of tertiary amine, monovalent groups of imidazole derivatives, monovalent group of triazole derivatives, monovalent groups of oxadiazole derivatives, divalent groups of at styrene, and divalent groups of fluorene and the group of groups in which the groups are substituted with a substituent.

The invention in a preferred embodiment (14) is characterized in that one kind of phosphorescent unit radiating in a certain one color or more than one kind of phosphorescent units radiating in certain more than one kind of colors different from each other is/are possessed in the phosphorescent compound as described in (1) above.

According to the invention as described in (14) above, radiation in a single color or a plurality of colors selected arbitrarily can be provided suitably since one kind of the phosphorescent unit radiating in the certain one color or more than one kind of the phosphorescent units radiating in the certain more than one kind of colors different from each other is/are possessed.

The invention in a preferred embodiment (15) is characterized in that the phosphorescent units include two kinds radiating in blue or green and in yellow or red, and radiate in white totally in the phosphorescent compound as described in (14) above.

According to the invention as described in (15) above, radiation in white color can be provided suitably, since the phosphorescent units include the two kinds radiating in blue or green and in yellow or red, and radiate in white totally.

The invention in a preferred embodiment (16) is characterized in that the phosphorescent units include three kinds radiating in blue, green and red, and radiate in white totally in the phosphorescent compound as described in (14) above.

According to the invention as described in (16) above, radiation in whine color can be provided suitably, since the phosphorescent units include the three kinds radiating in blue, green and red, and radiate in white totally.

The invention in a preferred embodiment (17) is phosphorescent composition, characterized in that the phosphorescent compound as described in (1) above is included.

According to the invention as described in (17) above, a suitable phosphorescent composition can be provided, since the phosphorescent compound as described in (1) above is included.

The invention in a preferred embodiment (18) is a phosphorescent composition characterized in that a plurality of the phosphorescent compounds as described in (14) above having one or more kinds of phosphorescent units radiating in colors different from each other are compounded.

According to the invention as described in (18) above, a suitable phosphorescent composition can be provided since a plurality of the phosphorescent compounds as described in (14) above having the one or more kinds of the phosphorescent units radiating in colors different from each other are compounded.

The invention in a preferred embodiment (19) is characterized in that white radiation is provided totally in the phosphorescent composition as described in (18) above.

According to the invention as described in (19) above, a suitable phosphorescent composition can be provided since white radiation is provided totally.

The invention in a preferred embodiment (20) is characterized in that a phosphorescent compound having a phosphorescent unit radiating in blue or green and a phosphorescent compound having a phosphorescent unit radiating in yellow or red are compounded, and white radiation is provided totally in the composition as described in (18) above According to the invention as described in (20) above, a suitable phosphorescent composition can be provided since the phosphorescent compound having a phosphorescent unit radiating in blue or green and the phosphorescent compound having a phosphorescent unit radiating in yellow or red are compounded, and white radiation is provided totally.

The invention in a preferred embodiment (21) is phosphorescent composition characterized in that the phosphorescent compound or the phosphorescent composition as described in any of (1) through (20) above and a carrier transporting polymer compound are compounded.

According to the invention as described in (21) above, stability and a long service life are provided since the phosphorescent composition is provided by compounding the phosphorescent compound or the phosphorescent composition as described in any of (1) through (20) above and a carrier transporting polymer compound. Also, a phosphorescent composition in which carrier balance is acceptable and emission efficiency is high can be provided by changing a ratio of the phosphorescent compound to the carrier transporting polymer compound.

The invention as in a preferred embodiment (22) is characterized in that the carrier transporting polymer compound is a hole transporting polymer compound in the phosphorescent composition as described in (21) above.

According to the invention as described in (22) above, stability and a long service life are provided since the carrier transporting polymer compound is the hole transporting polymer compound. Also, a phosphorescent composition in which carrier balance is acceptable and emission efficiency is high can be provided by changing a ratio of the phosphorescent compound to the hole transporting polymer compound.

The invention in a preferred embodiment (23) is characterized in that the carrier transporting polymer compound is an electron transporting polymer compound in the phosphorescent composition as described in (21) above.

According to the invention as described in (23) above, stability and a long service life are provided since the carrier transporting polymer compound is the electron transporting polymer compound. Also, a phosphorescent composition in which carrier balance is acceptable and emission efficiency is high can be provided by changing a ratio of the phosphorescent compound to the electron transporting polymer compound.

The invention in a preferred embodiment (24) is phosphorescent composition characterized in that the phosphorescent compound as described in any one of (1) through (20) above and a carrier transporting low-molecular compound are compounded.

According to the invention as described in (24) above, stability and a long service life are provided since the phosphorescent composition is provided by compounding the phosphorescent compound as described in any of (1) through (20) above and a carrier transporting low-molecular compound. Also, a phosphorescent composition in which carrier balance is acceptable and emission efficiency is high can be provided by changing a ratio of the phosphorescent compound to the carrier transporting low-molecular compound.

The invention in a preferred embodiment (25) is characterized in that the carrier transporting low-molecular compound is a hole transporting low-molecular compound in the phosphorescent composition as described in (24) above.

According to the invention as described in (25) above, stability and a long service life are provided since the carrier transporting low-molecular compound is the hole transporting low-molecular compound. Also a phosphorescent composition in which carrier balance is acceptable and emission efficiency is high can be provided by changing a ratio of the phosphorescent compound to the hole transporting low-molecular compound.

The invention in a preferred embodiment (26) is characterized in that the carrier transporting low-molecular compound is an electron transporting low-molecular compound in the phosphorescent composition as described in (24) above.

According to the invention as described in (26) above, stability and a long service life are provided since the carrier transporting low-molecular compound is the electron transporting low-molecular compound. Also, a phosphorescent composition in which carrier balance is acceptable and emission efficiency is high can be provided by changing a ratio of the phosphorescent compound to the electron transporting low-molecular compound.

The invention in a preferred embodiment (27) is characterized in that in an organic light-emitting device having one or more organic polymer layers interposed between an anode and a cathode, at least one layer of the organic polymer layer includes the phosphorescent compound or the phosphorescent composition as described in any of (1) through (20) above.

According to the invention as described in (27) above, an organic light-emitting device being stable and emitting a very highly efficient phosphorescence can be provided, since the at least one layer of the organic polymer layers includes the phosphorescent compound or the phosphorescent composition as described in any of (1) through (20) above.

The invention in a preferred embodiment (28) is characterized in that in an organic light-emitting device having one or more organic polymer layers interposed between an anode and a cathode, a color filter is provided between the anode and a transparent substrate on which the anode is provided, and at least one layer of the organic polymer layers includes the phosphorescent compound as described (15) or (16) above or the phosphorescent composition as described in (19) or (20) above.

According to the invention as described in (28) above, an organic light-emitting device being stable and emitting a very highly efficient color-light can be provided, since the color filter is provided between the anode and the transparent substrate on which the anode is provided, and the at least one layer of the organic polymer layers includes the phosphorescent compound as described in (15) or (16) above or the phosphorescent composition as described in (19) or (20) above.

The invention in a preferred embodiment (29) is characterized in that the anode is formed on a plastic substrate in the organic light-emitting device as described in (27) above.

According to the invention as described in (29) above, a flexible organic light-emitting device can be provided, since the anode is formed on the plastic substrate.

The invention in a preferred embodiment (30) is characterized in that the organic polymer layer is formed by an ink-jet method or a printing method in the organic light-emitting device as described in (27) above.

According to the invention as described in (30) above, an organic polymer layer with a large surface area can be simply fabricated since the organic polymer layer is formed by the ink-jet method or the printing method.

The invention in a preferred embodiment (31) is characterized in that in a display apparatus having a display screen, each pixel of the display screen includes the organic light-emitting device as described in (27) above, and the each pixel is driven by two or more transistors.

According to the invention as described in (31) above, a display apparatus with an active matrix system can be provided since the each pixel of the display screen includes the organic light-emitting device as described in (27) above, and the each pixel has two or more transistors.

BEST MODE FOR EMBODYING THE INVENTION

Next, embodiments of the present invention will be illustrated by reference to the drawings.

The present invention is an invention for an organic polymeric phosphorescent compound, which includes a repeat unit emitting phosphorescence (referred to a phosphorescent unit) and a repeat unit transporting a carrier such as an electron or an hole (referred to a carrier transporting unit), used as a material for an organic light-emitting device. The organic polymeric phosphorescent compound according to the present invention may be a random copolymer of which a phosphorescent unit and a carrier transporting unit are arranged randomly in a polymer chain, and is a non-ionic, that is, neutral polymer. In the phosphorescent compound according to the present invention, stability and a long service life are provided since the phosphorescent units and the carrier transporting units are linked in a polymer chain and aggregation of the phosphorescent units is suppressed, and further a very highly efficient emission can be realized since the phosphorescent, not fluorescent, unit is possessed.

Figure 1:
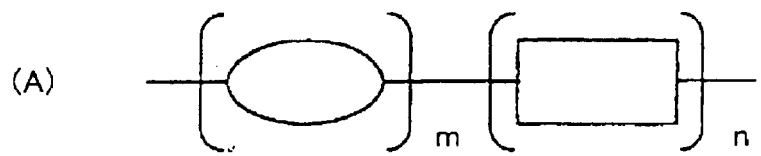
FIG. 1 is a diagram illustrating a typical structure of a phosphorescent compound of an organic polymer according to the present invention.
Figure 1:
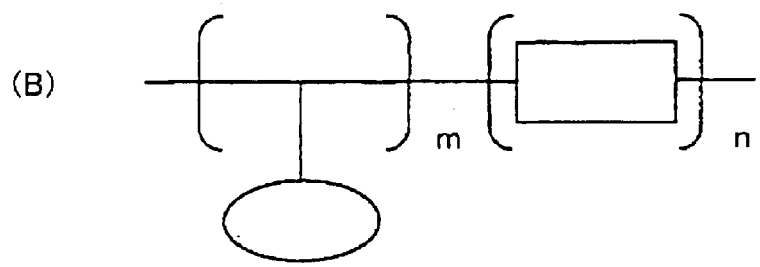
Figure 1:
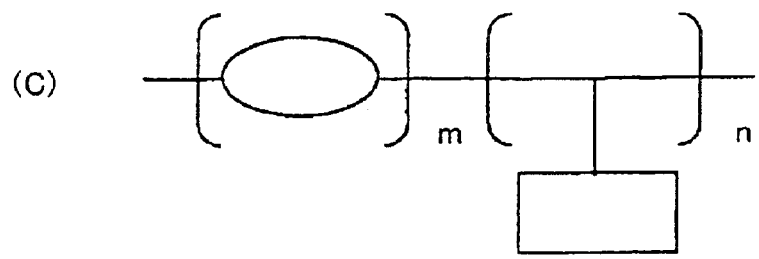
Figure 1:
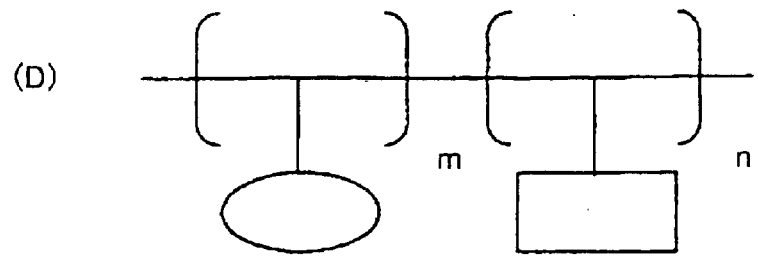

Typically, as shown in FIG. 1, the structure of the phosphorescent compound according to the present invention is classified, due to the types of monomers forming the phosphorescent units and the carrier transporting units, into four cases: (a) the case where the phosphorescent sites and the carrier transporting sites are together in a main chain of the polymer, (b) the case where the phosphorescent sites are in side chains of the polymer and the carrier transporting sites are in the main chain of the polymer, (c) the case where the phosphorescent sites are in the main chain of the polymer and the carrier transporting sites are in the side chains of the polymer, and (d) the case where the phosphorescent sites and the carrier transporting sited are together in the side chains of the polymer. Herein, the phosphorescent site represents a portion having a function of emitting phosphorescence in the phosphorescent unit and the carrier transporting site represents a portion having a function of transporting a carrier in the carrier transporting unit.

Herein, it is desired that at least one of the phosphorescent site and the carrier transporting site bond, as a side chain, to the main chain of the polymer of the phosphorescent compound (FIG. 1(b)–(d)). In this case, it is easy to synthesize the phosphorescent compound and a phosphorescent compound that is easy to dissolve in an organic solvent can be provided.

Furthermore, in order to provide a phosphorescent site of which emission efficiency of phosphorescence is high, it is desired that the phosphorescent site be a monovalent group and a divalent group of a complex with a transition metal or a rare earth metal.

As examples of the phosphorescent sites, provided is a monovalent group or a divalent group of a transition metal complex or a monovalent group or a divalent group of a rare earth metal complex including a ligand selected from the group showing:

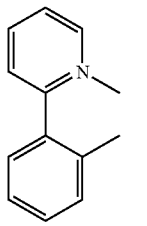
R-1

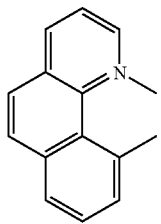
R-2

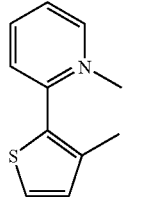
R-3

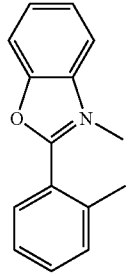
R-4

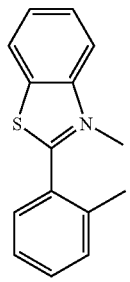
R-5

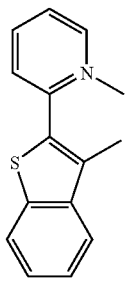
R-6

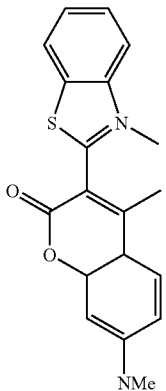
R-7

R-8

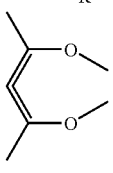
acac

The transition metals used in the above mentioned transition metal complex include the first transition element series of the periodic table, that is, Sc with the atomic number of 21 through Zn with the atomic number of 30; the second transition element series, that is, Y with the atomic number of 39 through Cd with the atomic number of 48; and the third transition element series, that is, Hf with the atomic number of 72 through Hg with the atomic number of 80. Also, the rare earth metals used in the above mentioned rare earth metal complex include the lanthanide series of the periodic table, that is, La with the atomic number of 57 through Lu with the atomic number of 71. Furthermore, the ligand may be a ligand different from the above mentioned ligands.

Examples of the carrier transporting sites with high carrier transporting property are different between the case where the organic polymeric phosphorescent compound according to the present invention is a hole transporting polymer and the case where the organic polymeric phosphorescent compound according to the present invention is an electron transporting polymer.

In the case of the hole transporting polymer, monovalent groups of carbazole (HT-1) being a tertially amine, triphenylamine (HT-2), a multimer thereof (HT-3), etc. as shown in

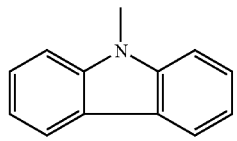

HT-1

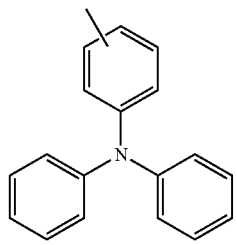

HT-2

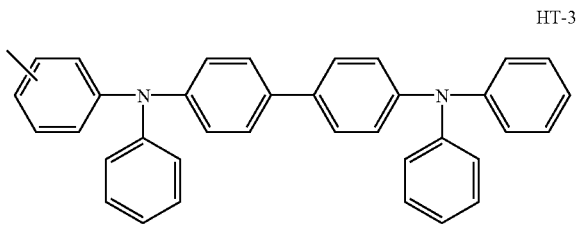

HT-3 are typical and these monovalent groups may be substituted with a substituent.

In the case of the electron transporting polymer, monovalent groups of oxadiazole derivatives (ET-1, 2), triazole derivatives (ET-4), or imidazole derivatives (ET-3) as shown in

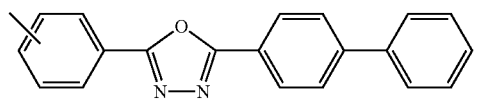

ET-1

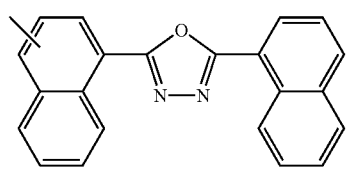

ET-2

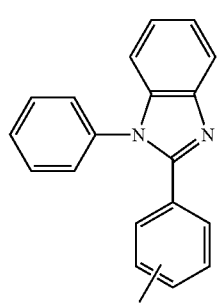

ET-3

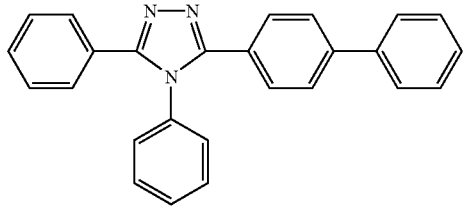

ET-4 are provided. Aromatic rings in the monovalent groups of these derivatives maybe substituted with a substituent. Also, a divalent group of thiophene (TF), a divalent group of benzene (PP), a divalent group of styrene (PV), or a divalent group of fluorene (FO), substitute with a substituent, having a capability of transporting a hole and forming a polymer of which a main chain is a conjugate system in fluorescent polymers, as shown in

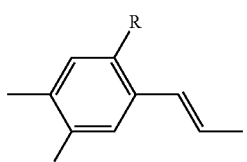

PV

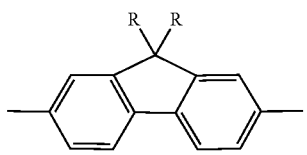

FO

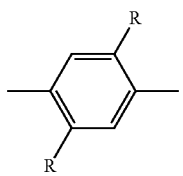

PP

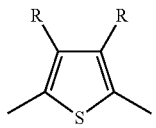

TF may be employed. Herein, substituent R represents an alkyl group or an alkoxy group. In the phosphorescent compound according to the present invention, these divalent groups are incorporated into the main chain of the polymer as carrier transporting sites.

As examples of copolymers including the above mentioned repeat units, provided are polymers (P1, P3, P4) having a monovalent group of a iridium complex or a platinum complex of the phosphorescent site and a monovalent group of carbazole or a derivative thereof as the hole (carrier) transporting site to the side chains of the vinyl structure being the main chain, and also a polymer (P2) using a monovalent group of an oxadiazole derivative as the electron (carrier) transporting site to the side chains, as shown in P1
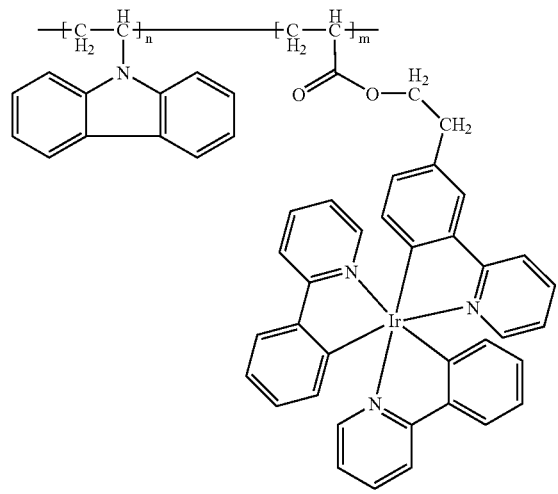

P2
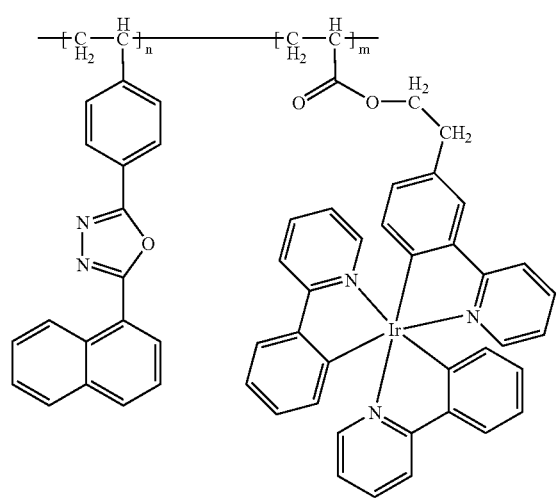

P3
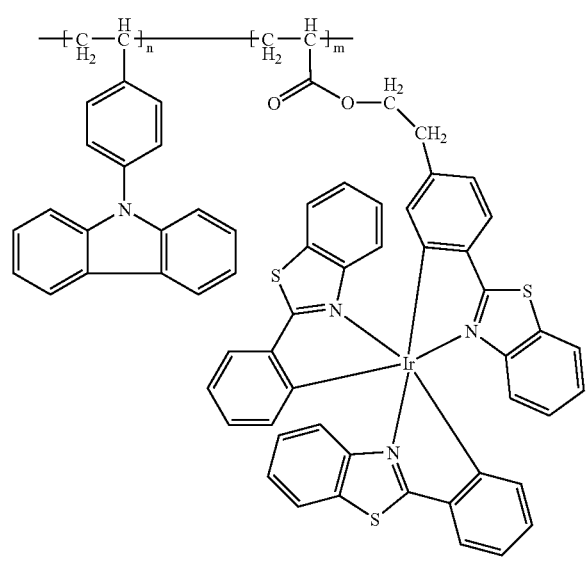

P4
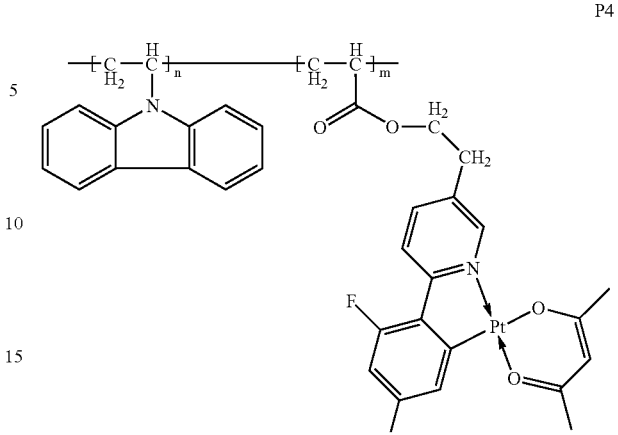

These copolymers can be synthesized via a radical copolymerization using a reaction initiator from a vinyl compound. A monomer in which a polymerizable functional group is introduced to one of ligands of an iridium complex is synthesized, for example, by the following method. The synthesis method is such a method that an intermediate in which one reactive substituent (hydroxyl group, amino group, etc.) has been introduced to each of the three ligands is prepared, this intermediate and a compound having a polymerizable functional group (polymerizable acid halides, polymerizable isocyanate, etc.) are reacted at a molar ratio close to 1:1, and the product is purified to obtain a monofunctional monomer. Furthermore, after the above mentioned reaction, in order to render reactive substituents remaining in the product non-reactive, the product and a non polymerizable compound (alkyl halides, carboxylic acid halides, etc.) are reacted.

Moreover, also provided is a copolymer with such a structure that one of the ligands of the iridium complex is acetylaceton or picolinic acid and the iridium complex bonds to the main chain of the polymer via this acetylaceton, etc. as shown in

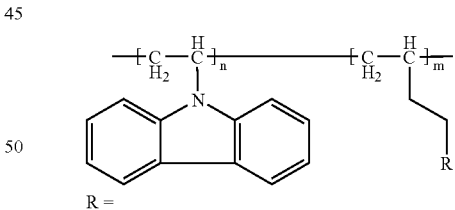

R =

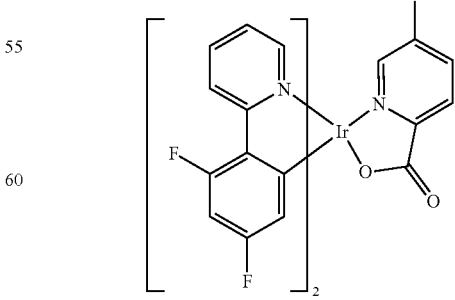

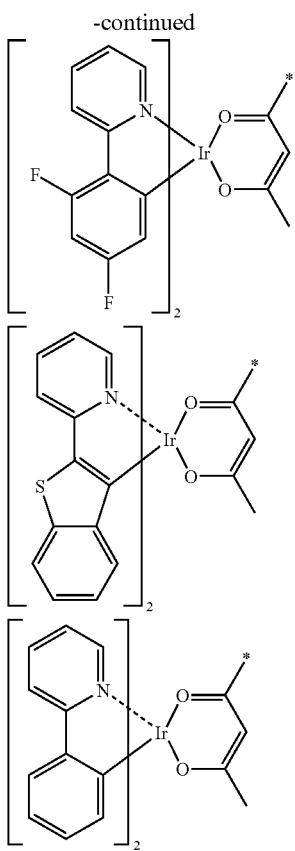

Herein, * marks in the chemical formulas denote portions (bonds) connecting to substituents R shown in the chemical formulas of the polymer.

As described above, a monomer of an iridium complex in which two kinds of ligands (those of which two are coordinated are referred to first ligands and those of which one is coordinated are referred to second ligands) are introduced and a polymerizable functional group to the second ligand is possessed, is synthesized, for example, by the following method. The synthesis method is such a method that a binuclear complex with iridium synthesized by the well-known method (S. Lamansky, et al., Inorganic Chemistry, 40, 1704(2001)) and the second ligand having a polymerizable functional group are reacted to obtain a mononuclear iridium complex having a polymerizable functional group. Also, the binuclear complex and a second ligand having a reactive substituent may be reacted to obtain a mononuclear iridium complex having a reactive substituent, and this and a compound having a polymerizable functional group may be reacted to obtain a mononuclear iridium complex having a polymerizable functional group.

Also, as the above mentioned copolymer, when a transition metal complex portion of an iridium complex, phosphorescent site bonds, as a side chain, to a main chain of the polymer, it is preferable that a spacer portion be interposed between a monovalent group of the transition metal complex or the rare earth metal complex and the main chain of the polymer.

The spacer portion is a portion bonding between a multivalent atom to which an atom allowable to be substituted bonds in the polymer compound constituting a main chain and a multivalent atom to which an atom allowable to be substituted bonds in a low-molecular compound forming the basis of phosphorescent site. It is preferable that such a spacer portion be a structure including an organic group in which the number of carbons is 1 through 30 and a hetero atom may be contained or an inorganic group in which the number of hetero atoms is 1 through 10 and a carbon atom not be contained.

As the spacer portion, for example, an alkylene group in which the number of carbons is 1 through 20, and linking groups such as (S-1) through (S-15), etc. as shown in

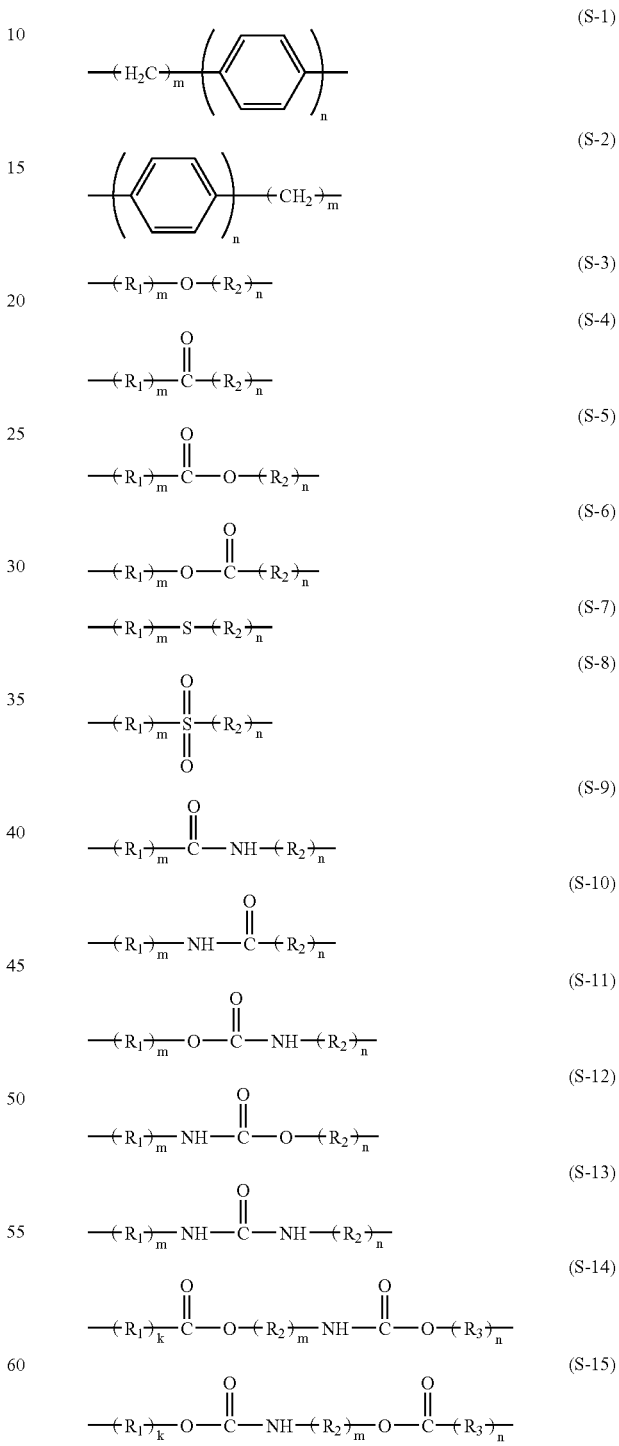

can be provided, but are not limited to them.

Furthermore, in (S-1) through (S-15), $R_1$, $R_2$, and $R_3$ represent independently a methylene group, or a substituted or non-substituted phenylene group respectively, and k, m, and n are independently 0, 1, or 2 respectively.

Also, a copolymer with a structure in which the phosphorescent site and the carrier transporting site are incorporated into not side chains but a main chain is provided.

Substituted divalent group of thiophene, benzene, and fluorene and a divalent group of an iridium complex are polymerized to form a main chain as shown in

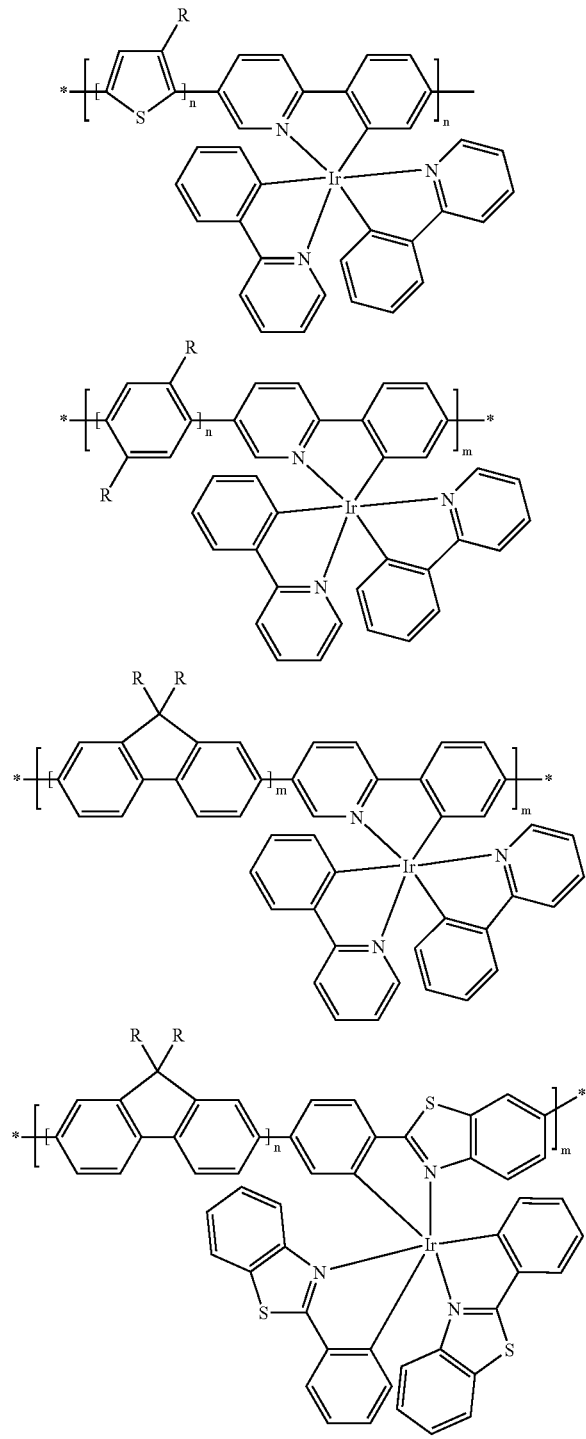

Thus, as examples of coplymers, although copolymers of either the hole transporting site or the electron transporting site and the phosphorescent site have been provided, the phosphorescent compound according to the present invention may be a copolymer of the hole transporting site, the electron transporting site, and the phosphorescent site. In this case, the hole transporting site, the electron transporting site, and the phosphorescent site may independently form a main chain of the copolymer respectively, and also may form side chains.

As the repeating number of the phosphorescent unit(s) is m and the repeating number of the carrier transporting unit(s) is n, in the present invention, in order to improve emission efficiency of phosphorescence, the relationship m<n, that is, the repeating number of the phosphorescent unit(s) being smaller than the repeating number of the carrier transporting unit(s), is desired. Hence, both of m and n are natural numbers of 1 or more. On the other hand, in the case of m≧n, emission of the luminescence is suppressed by concentration quenching. Furthermore, in order to realize a very highly efficient emission of phosphorescence, it is preferable that the ratio of the repeating number of the phosphorescent unit(s) to the total number of the phosphorescent unit(s) and the carrier transporting unit(s) be equal to or less than 0.2. Also, as the ratio of the repeating number of the phosphorescent unit(s) is too small, the phosphorescent site(s) is/are reduced and the emission efficiency falls down. Thus, the ratio of the repeating number of the phosphorescent unit(s) has to be not too small, and is desired to be equal to or more than 0.0001. That is, $$0.0001 \leq m/(m+n) \leq 0.2$$

is desired.

The phosphorescent compound according to the present invention may have one kind of phosphorescent unit radiating in one color and also may have two or more kinds of phosphorescent units radiating in two or more colors different from each other.

In the phosphorescent compound according to the present invention, by introducing two or more kinds of phosphorescent units radiating in two or more colors different from each other, a luminescent color that can not be obtained for a phosphorescent compound having only one kind of phosphorescent unit radiating in one color can be obtained.

For example, by introducing three kinds of phosphorescent units radiating in blue, green, and red respectively to one compound in an appropriate proportion, a phosphorescent compound for white luminescence can be obtained. Herein, the phosphorescent unit radiating in blue, green, or red is such that a luminescent color of photoluminescence shows blue, green, or red respectively in the case of forming one phosphorescent compound employing each one independently or, furthermore, such that the luminescent color shows blue, green, or red respectively in the case of fabricating and lighting the organic light-emitting device mentioned below.

Furthermore, the blue color of the luminescent color mentioned herein is such that a peak wavelength in an emission spectrum is in 400 through 490 nm. Likewise, the green color is such that the peak wavelength is in 490 through 570 nm, and the red color is such that the peak wavelength is in 570 through 700 nm.

Also, the phosphorescent compound for white luminescence can be obtained by introducing two kinds of phosphorescent units radiating in blue or green and yellow or red respectively to one compound in appropriate proportion.

Furthermore, the blue color or the green color of the luminescent color mentioned herein is such that peak wavelength in an emission spectrum is in 400 through 570 nm, and likewise, the yellow color or the red color is such that the peak wavelength is in 570 through 700 nm.

Also, the phosphorescent material for white luminescence can be obtained not only as the single phosphorescent compound as described above but also as a composition in which a plurality of phosphorescent compounds having one or more phosphorescent units showing luminescent colors different from each other are compounded.

For example, a phosphorescent composition in which a first phosphorescent compound having two kinds of phosphorescent units that are a phosphorescent unit radiating in blue color and a phosphorescent unit in green color and a second phosphorescent compound having one kind of phosphorescent unit radiating in red color are compounded, a phosphorescent composition in which three phosphorescent compounds having each kind of the phosphorescent units radiating in blue, green, and red color, respectively are compounded, and a phosphorescent composition in which two phosphorescent compounds having each kind of the phosphorescent units radiating in blue and orange colors respectively are compounded, etc. can be given but any limitations are not provided to them.

It is desired that a film of the organic polymeric phosphorescent compound according to the present invention can be formed by a wet process. In the wet process, since a solution of the phosphorescent compound is provided, solubility in an organic solvent or water is needed. Particularly, in order to make the phosphorescent compound soluble in the organic solvent, it is desired to use a metal complex substituted with a relatively long carbon chain such as an alkyl group, or an alkoxy group, etc., as a phosphorescent site.

For the organic polymeric phosphorescent compound according to the present invention, it is desired that a degree of polymerization be in 5 through 5000. As the degree of the polymerization is less than 5, formation of a uniform film is difficult and crystallization is caused easily to reduce the stability. Also, an organic polymer of which a degree of polymerization is larger than 5000 is difficult to produce and is difficult to dissolve into an organic solvent. Therefore, as the degree of the polymerization is in 5 through 5000, a uniform and stable film can be formed.

Next, the organic light-emitting device according to the present invention will be illustrated.

For the organic light-emitting device according to the present invention, the organic polymeric phosphorescent compound according to the present invention described above can be employed as a luminescent material.

Also, for the organic light-emitting device according to the present invention, in order to further improve carrier transporting property of the phosphorescent compound according to the present invention, a composition in which the phosphorescent compound according to the present invention and the carrier transporting compound can be employed as a luminescent material.

That is, when the phosphorescent compound according to the present invention is a hole transporting one, an electron transporting compound can be admixed, and also when the phosphorescent compound according to the present invention is an electron transporting one, a hole transporting compound can be admixed. In these cases, the electron transporting compound and the hole transporting compound may be a low-molecular compound and also a polymer compound, respectively.

As the low-molecular hole transporting compound being compounded into the phosphorescent compound according to the present invention, a known hole transporting material represented by triphenylamine derivatives such as TPD (N,N'-diphenyl-N,N'-(3-methylphenyl)-1,1'-biphenyl-4,4'-diamine), α-NPD (4,4'-bis[N-(1-naphtyl)-N-phenylamino]biphenyl), m-MTDATA (4,4',4"-tris(3-methylphenylphenylamino)triphenylamine), etc., and carbazole derivateives such as CBP (4,4'-N-N'-dicarbazole-biphenyl), etc. can be used but limitation is not provided to them.

Also, as the polymer hole transporting compound compounded into the phosphorescent compound according to the present invention, polyvinylcarbazole, and one provided by introduction of a polymerizable functional group to a triphenylamine-based low-molecular compound and polymerization, for example, the polymer compound with a triphenylamine skeleton disclosed in Japanese Laid-Open Patent Application No. 8-157575 can be used but a limitation is not provided to them.

On the other hand, as the low-molecular electron transporting compound compounded into the phosphorescent compound according to the present invention, a quinolinol derivatives metal complex such as $Alq_3$ (trisaluminumquinolinol), etc., oxadiazole derivatives, triazole derivatives, Imidazole derivatives, and triazine derivatives, etc. can be used but a limitation is not provided to them.

Also, as the polymer electron transporting compound compounded into the phosphorescent compound according to the present invention, one provided by introduction of a polymerizable functional group to the low-molecular electron transporting compound described above, for example, polyPBD disclosed in Japanese Laid-Open Patent Application No. 10-1665 can be used but a limitation is not provided to them.

In addition, in order to further improve the physical properties, etc. of a film obtained by a film formation, a polymer compound not relating to the luminescence property is admixed into the phosphorescent compound or the phosphorescent composition according to the present invention to provide a composition, and this can also be employed as the luminescent material. For example, in order to give flexibility to the film, PMMA (polymethyl methacrylate) can be admixed, but a limitation is not provided to it.

The present invention also provides an organic light-emitting device characterized in that the organic polymer phosphorescent compound as described above is included in at least one layer. For the organic light-emitting device according to the present invention, since phosphorescent unit(s) and carrier transporting unit(s) of the phosphorescent compound are linked in a polymer chain, aggregation of the phosphorescent unit(s) of the phosphorescent compound caused by continuous running or overheating of the organic light-emitting device is suppressed to be able to provide a stable display apparatus, and since the phosphorescent, not fluorescent, unit is possessed, a very highly efficient emission can be realized.

Figure 2:
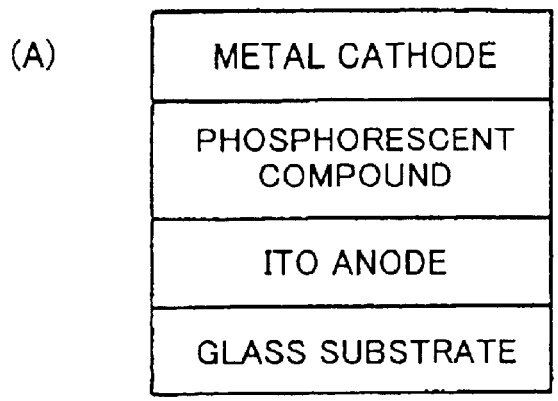
FIG. 2 is a diagram illustrating a laminated structure of an organic light-emitting device according to the present invention.
Figure 2:
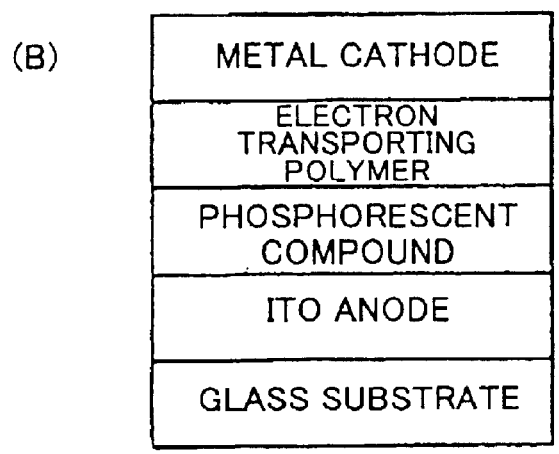
Figure 2:
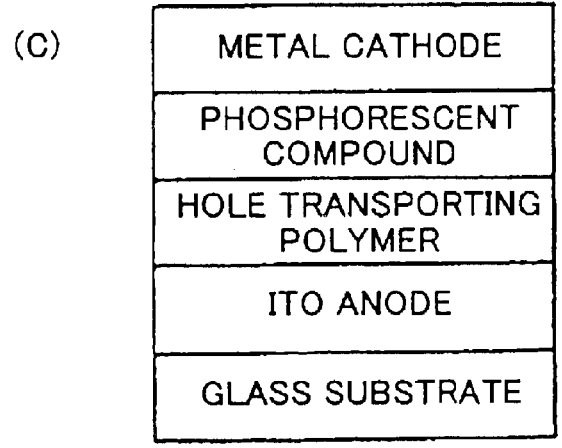

Although, as shown in FIG. 2(a), the organic light-emitting device in which the phosphorescent compound according to the present invention is employed functions in a mono-layer structure such that the phosphorescent compound according to the present invention is interposed between an anode and a cathode in a pair, in order to improve the emission efficiency of phosphorescence, a laminated construction with an electron transporting layer in which an electron transporting polymer is employed, like FIG. 2(b) or a laminated construction with a hole transporting layer in which a hole transporting polymer is employed, like FIG. 2(c) are desired. As these carrier (electron and hole) transporting polymers, given are a polymer including a group of tertiary amines and derivatives thereof (HTP1,2), oxadiazole derivatives (ETP1,2), or imidazole derivatrives (ETP3), polyparaphenylenevinylene (CP1), and polydialkylfluorenes (CP2) such as

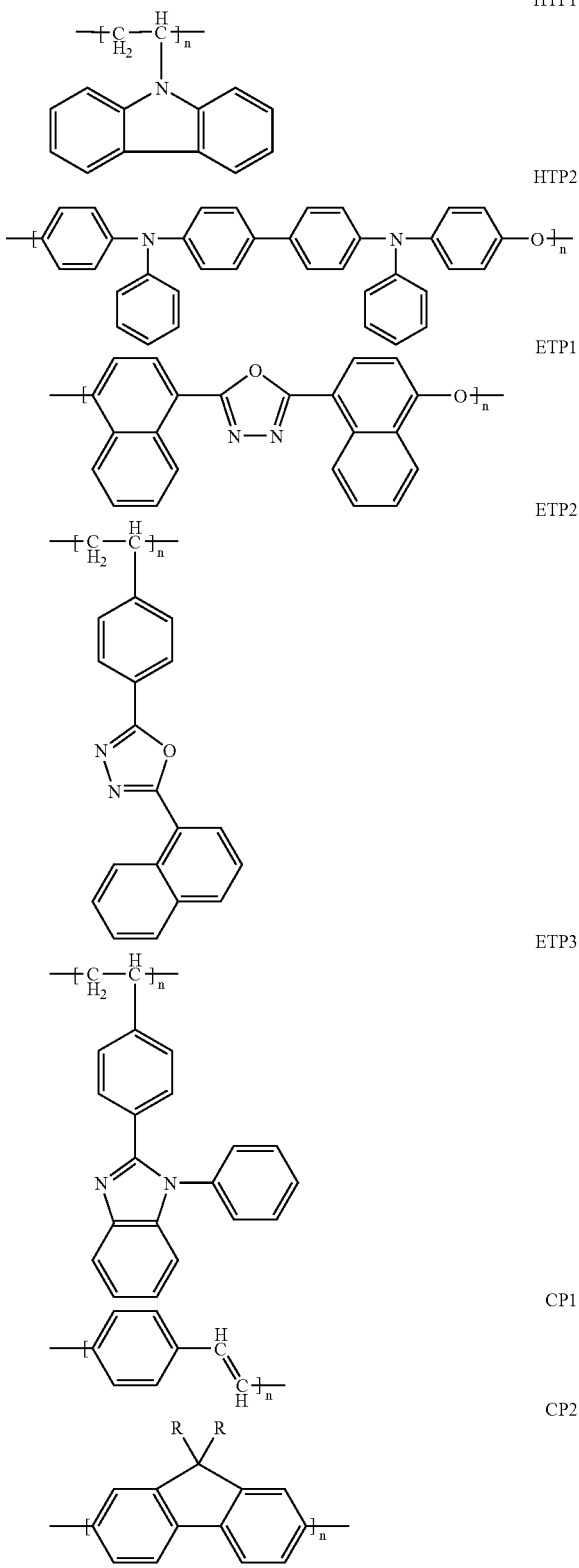

In the light-emitting device having the laminated construction of FIG. 2(b), the emission mechanism will be briefly explained for an organic light-emitting device in which the above mentioned P1 polymer is employed as the phosphorescent compound and the polymer ETP2 including a group of oxadiazole derivatives is employed as the electron transporting polymer. Electrons injected from the cathode are transported through the electron transporting layer and injected into the phosphorescent compound P1 layer, while holes injected from the ITO anode conduct on repeat units including a carbazole ring of the phosphorescent compound P1. By the recombination of injected electrons with holes on the carbazole ring, an excited state of the repeat unit of the carbazole ring is created, and then energy transfers to the repeat unit of the iridium complex. As a result, a triplet excited state is created on the repeat unit of the iridium complex, and an emission of phosphorescence is observed because of energy relaxation. However, a mechanism such that recombination of the injected holes and electrons occurs on the repeat units of the iridium complex can be also considered.

The anode is generally formed on a glass substrate being a transparent substrate and an emission transmitting material is employed. ITO (indium tin oxide), indium oxide, tin oxide, or an indium oxide-zinc oxide alloy is preferable. A thin film of metal such as gold, platinum, silver, magnesium, etc. may be employed. Also, an electrically conductive polymer including polyaniline, polythiophen, polypyrrole, and derivatives thereof can be used.

For the cathode, it is preferable to employ an alkali metal such as Li, K, etc. and an alkali earth metal such as Mg, Ca, etc., of which work functions are small, from a viewpoint of electron injection efficiency. It is also desired to employ Al etc. that is chemically stable compared to these metals. In order to provide both the electron injection efficiency and chemical stability, a layer including two or more kinds of materials may be provided. Those materials are described in Japanese Laid-Open Patent Application No. 2-15595 and Japanese Laid-Open Patent Application No. 5-121172, etc. and a thin layer (approximately, 0.01–10 μm) of an alkali metal and an alkali earth metal such as cesium, calcium, strontium, barium, etc. may be interposed below the Al layer (suppose that the side of the cathode is the upper side and the side of the anode is the lower side).

The anode and the cathode can be formed by a publicly known method such as a vacuum evaporation method, a sputtering method, an ion plating method, etc. Also, it is preferable that a patterning for an electrode (particularly, an electrode of an emission transmitting material) be performed by a chemical etching such as photolithography, etc. and a physical etching utilizing a laser, etc. The patterning may be provided by superimposing a mask and performing vacuum evaporation or sputtering.

In the present invention, as a transparent substrate, a plastic substrate can be used besides the usual glass substrate. A plastic employed as a substrate is required to be excellent in respect to heat resistance, dimensional stability, solvent resistance, electrical insulation properties, processibility, low gas permeability, and low hygroscopicity. As such plastic, polyethylene terephthalate, polyethylene naphthalate, polystyrene, polycarbonate, polyethersulfone, polyallylate, and polyimide, etc. can be provided. A flexible organic light-emitting device can be provided by employing these flexible substrates. It is preferable that a moisture penetration preventing layer (gas barrier layer) be located on the surface of the substrate at the side of the electrode or the surface at the opposed side of the electrode, or the both surfaces. As the material for forming the moisture penetration preventing layer, inorganic materials such as silicon nitride and silicon oxide, etc. are preferred. A film of the moisture penetration preventing layer can be formed by high-frequency sputtering method, etc. Additionally, a hard-coat layer and an under-coat layer may be provided if necessary.

As a film formation method of a layer of an organic polymer such as the phosphorescent compound, the electron transporting polymer, and the hole transporting layer, etc., a spin-coating method from a solution is common, and besides it as the method capable of easily fabricating an organic polymeric layer with large surface area, a printing method, an ink-jet method, a spray method, and a dispenser method can be provided but a limitation is not be provided to them. Thus, in a display apparatus of which each pixel of a display screen includes the organic light-emitting device according to the present invention, an organic polymer can be applied separately for each of the pixels so that the display screen of the display apparatus can be made full color. Particularly for the ink-jet method, this separate application for each of the pixels and making the display screen full color can be performed easily.

In the display apparatus of which each pixel of the display screen includes the organic light-emitting device according to the present invention, due to arranging two or more transistors for each of the pixels and addressing and driving the pixels by these transistors, a display apparatus with an active matrix system can be provided. One of at least two necessary transistors is a driving transistor for injecting an electrical current into an organic light-emitting device forming a pixel, and the other one is a switching transistor for controlling on/off for the electrical current injected into this driving transistor. Furthermore, as organic transistors are employed as these transistors, an application to a plastic substrate is allowed.

EXAMPLES

Examples of the phosphorescent compounds according to the present invention and synthesis methods thereof will be illustrated below. These examples are only exemplifications for explanation and the present invention is not limited by these examples.

Example 1-1

Synthesis of the monomer of the phosphorescent compound; [2-(3-methacrylphenyl)pyridine]bis[2-(3-propionylphenyl)pyridine]iridium(III) (simplified as Ir(MPPy)(PrCOPPy)$_2$ below)

First, 2-(3-methoxyphenyl)pyridine (MeOPPy) was synthesized according to the usual method of scheme (1).

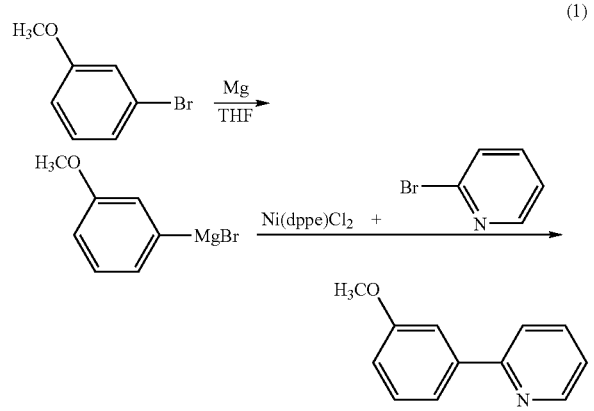

Specifically, 3-methoxyphenylmagnesiumbromide was synthesized from 8.98 g (48 mmol) of 3-bromoanisole using Mg in 60 ml of dried tetrahydrofuran (THF). Furthermore, the preceding obtained 3-methoxyphenylmagnesiumbromide was added into the solution in which 6.32 g (40 mmol) of 2-bromopyridine and 0.74 g of [1,2-bis(diphenylphosphino)ethane]dichloronickel (0) (Ni(dppe)Cl$_2$) had been dissolved into 40 ml of dried THF, and reaction was performed for 12 hours at room temperature to obtain 6.03 g (32.4 mmol) of colorless and transparent 2-(3-methoxyphenyl)pyridine (MeOPPy). Identification was performed by CHN elemental analysis, NMR, and IR.

Next, MeOPPy obtained in scheme (1) and tris (acetylacetonato)iridium(III) (Ir(acac)$_3$) were reacted at high temperature to synthesize tris(2-(3-methoxyphenyl)pyridine)iridium(III) (Ir(MeOPPy)$_3$) as shown in scheme (2).

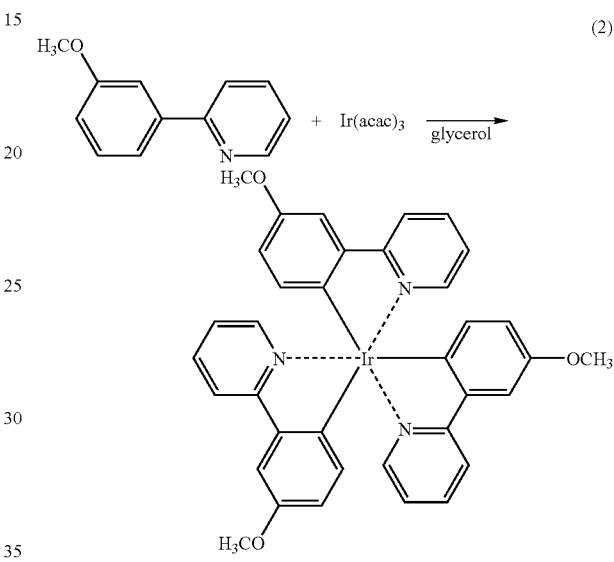

Specifically, 0.50 g (2.70 mmol) of MeOPPy and 0.20 g (0.41 mmol) of Ir(acac)$_3$ were reacted in 20 ml of glycerol for 9 hours at 250° C. and purification was made in a column to obtain 0.020 g (0.027 mmol) of Ir(MeOPPy)$_3$ as fluorescent yellow powder. Identification was performed by CHN and Ir elemental analysis and IR.

MeO groups of Ir(MeOPPy)$_3$ obtained in scheme (2) were hydrolyzed to OH groups in hydrochloric acid aqueous solution to obtain powder of tris(2-(3-hydroxyphenyl) pyridine)iridium(III) (Ir(HOPPy)$_3$) according to the usual method of scheme (3).

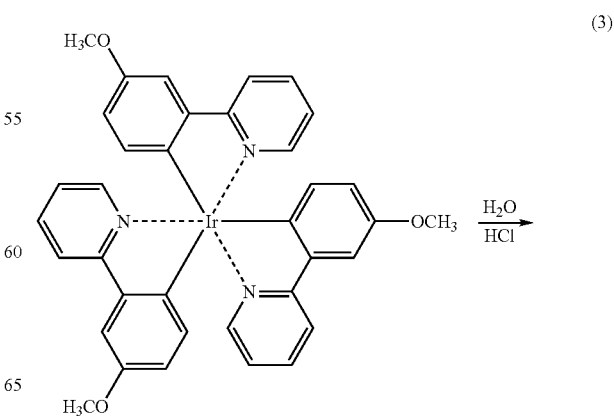

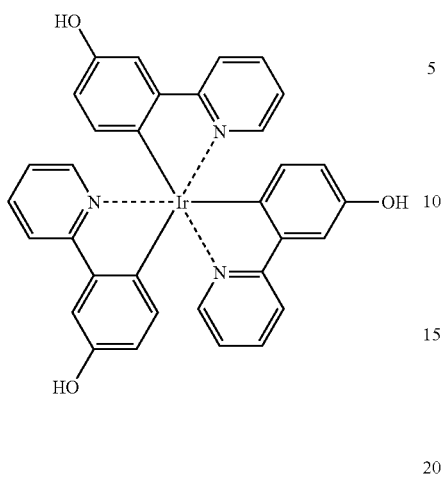

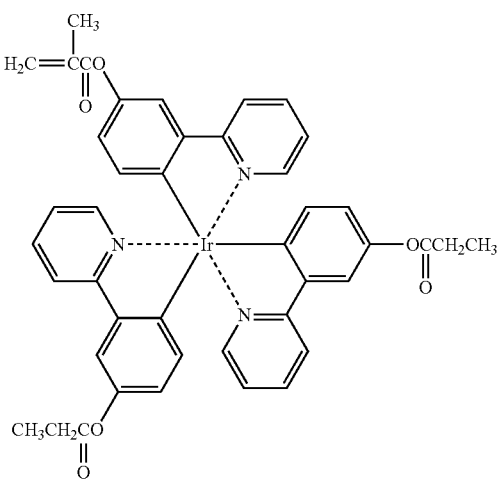

Ir(HOPPY)₃ obtained in scheme (3) was reacted with methacrylic acid chloride at molar ratio of 1:1 to perform methacrylation of a part of OH groups and to synthesize a complex based on Ir(Mppy)(HOPPy)₂ according to scheme (4). Then, the residual OH groups were reacted with propionic acid chloride (PrCOCl) to obtain a complex based on Ir(MPPy)(PrCOPPy)₂.

Specifically, after 8 ml of dried THF, 0.706 g (1 mmol) of Ir(HOPPy)3 and 0.600 g (5.9 mmol) of triethylamine were put into a reactor, a solution in which 0.106 g (1 mmol) of methacrylic acid chloride was dissolved into 4 ml of dried THF was dropped for 30 minutes and reaction was performed for 5 hours at 20° C. A solution in which 0.370 g (4 mmol) of propionic acid chloride was dissolved into 4 ml of dried THF was further dropped into this reacted solution for 30 minutes and reaction was performed for 5 hours at 20° C. so that the residual OH groups was reacted, and a hydrochloride of triethylamine was filtered and separated. The solvent in the filtrate was evaporated and exsiccated and the obtained solid content was purified by performing recrystallization in chloroform/methanol-mixed solvent twice, to obtain 0.523 g (0.59 mmol) of objective Ir(MPPy)(PrCOPPy)₂ as powder. Identification for this complex was performed by CHN and Ir elemental analysis and IR.

(4)

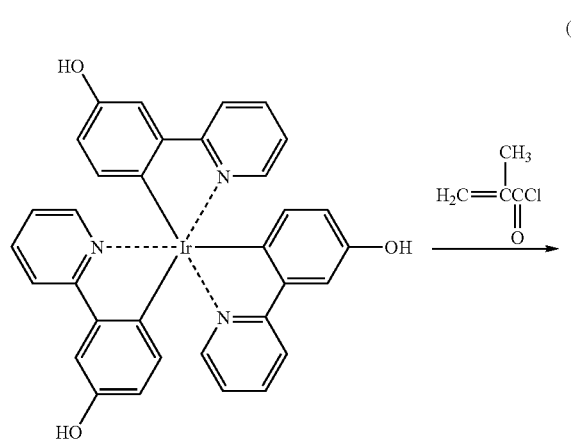

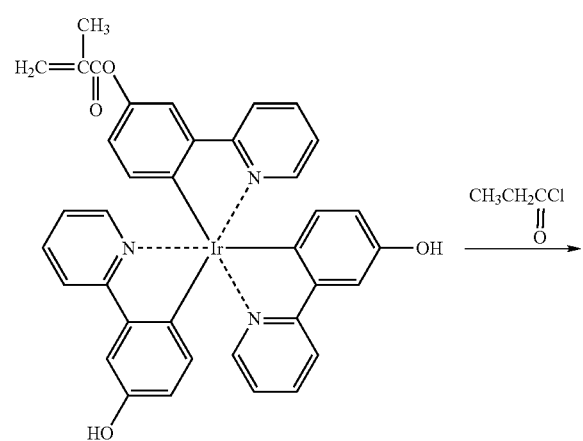

Example 1-2

Synthesis of the phosphorescent compound; [2-(3-methacrylphenyl)pyridine]bis[2-(3-propionylphenyl)pyridine]iridium(III)/N-vinylcarbazole copolymer (simplified as Ir(Mppy) (PrCOPPy)₂/VCz copolymer below)

According to scheme (5), after 0.222 g (0.25 mmol) of Ir(MPPy) (PrCOPPy)₂ complex synthesized in example 1, 0.918 g (4.75 mmol) of N-vinylcarbazole (VCz) (Ir(MPPy)(PrCOPPy)₂ and VCz being in molar ratio of 5:95) 0,010 g (0.061 mmol) of 2,2'-azobis(isobutyronitrile) (AIBN), 10 ml of butyl acetate were put into a reactor and replacement with nitrogen was performed, reaction was performed for 10 hours at 80° C.

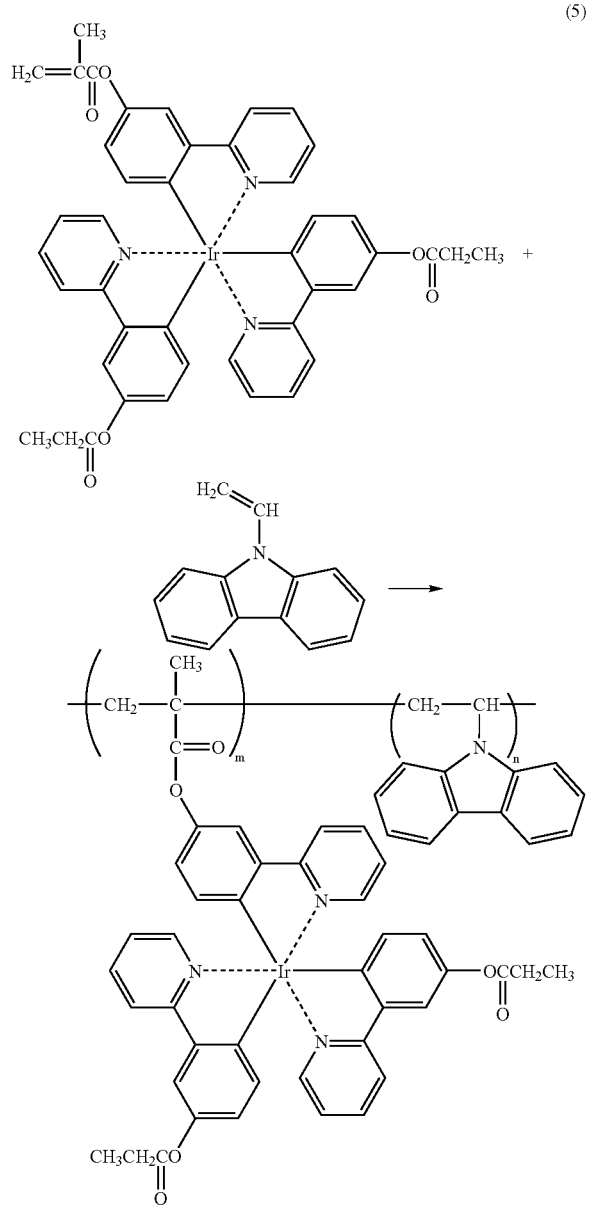

(5)

After the reaction, the product was thrown into acetone, reprecipitation was performed, and a copolymer was recovered by filtration. Throwing of a solution of the recovered copolymer in chloroform into methanol for reprecipitation was further performed twice for purification and vacuum drying was performed after recovering the precipitation, to obtain 0.946 g of objective Ir(MPPy) (PrCOPPy)$_2$/VCz copolymer as powder. CHN and Ir elemental analysis for the obtained copolymer supported that Ir(MPPy) (PrCOPPy)$_2$ and VCz copolymerized in molar ratio of 5:95. That is, the repeating number m of the phosphorescent units/the repeating number of the carrier transporting units n=5/95 is considered. Also, from GPC for the copolymer in chloroform, weight-average molecular weight was 12000 relative to the polystyrene standard (an average degree of polymerizaion calculated from the weight-average molecular weight being 37). Furthermore, the phosphorescent compound according to the present invention is soluble in an organic solvent such as chloroform, etc.

Example 1-3

Fabrication of an Organic Light-emitting Device

A solution of Ir(MPPy) (PrCOPPy)$_2$/VCz copolymer and an oxadiazole derivative (tBu-PBD) being an electron transporting material in chloroform was prepared. The proportion was 65 percent by weight for Ir(MPPy) (PrCOPPy)$_2$/VCz copolymer to 35 percent by weight for tBu-PBD. This solution was spin-coated on a glass substrate with indium tin oxide (ITO) being a transparent electrode to form a film with the thickness of 100 nm, and 10 nm of Ca and 100 nm of Al were deposited on it by a vacuum evaporation to provide a cathode. As a positive electrical voltage was applied on the ITO-side of this organic light-emitting device and a negative electrical voltage was applied on the Al-side, green luminescence originating from the iridium complex was observed. The quantum yield of the luminescence was approximately 4%.

Example 2-1

Synthesis of the monomer of the phosphorescent compound; {2-[3-(2-methacryloyloxyethyl) carbamoyloxyphenyl]pyridine}bis[2-(3-propionylphenyl) pyridine]iridium(III) (simplified as Ir(MiPPy) (PrCOPPy)$_2$ below)

The intermediate of the monomer Ir(HOPPy)$_3$ synthesized in the example 1-1 was reacted with methacryloyl oxyethylisocyanate (MOI, produced by Showa Denko K. K.) at 1:1, and subsequently the residual OH group was reacted with PrCOCl to obtain a complex based on Ir(MiPPy) (PrCOPPy)$_2$, as shown in scheme (6).

(6)

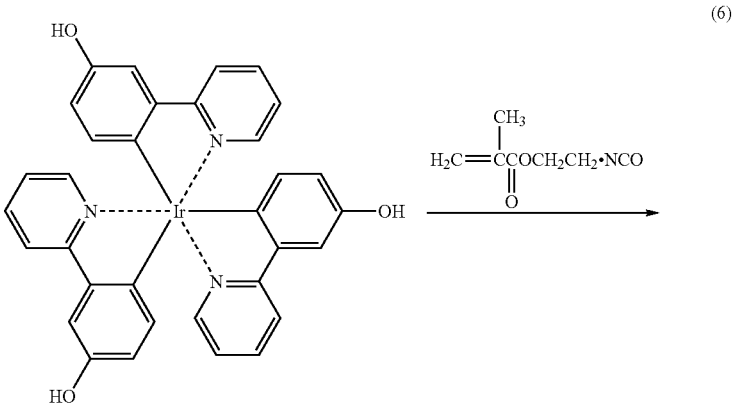

-continued

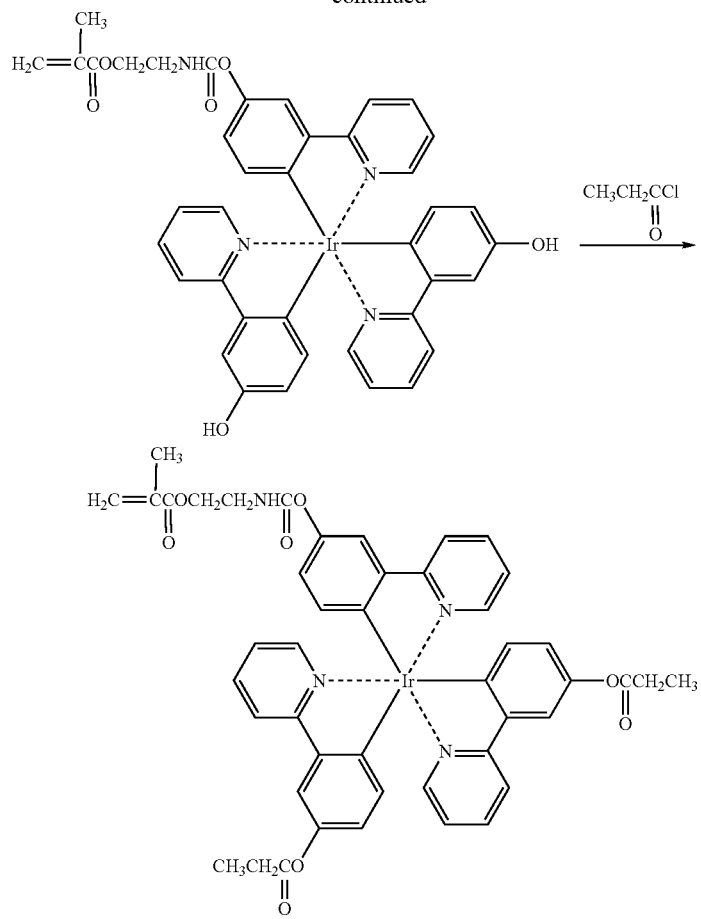

Specifically, 8 ml of dried THF, 0.706 g (1 mmol) of Ir(HOPPy)$_3$, and 0.106 g (1 mmol) of MOI were put into a reactor and reaction was performed for 5 hours at 20° C. After 0.600 g (5.9 mol) of triethylamine as a deoxidizer was added into this reacted solution, a solution in which 0.370 g (4 mmol) of propionylchloride was dissolved into 4 ml of dried THF was dropped for 30 minutes and, furthermore, reaction was performed for 5 hours at 20° C. so that the residual OH groups was reacted, and hydrochloride of triethylamine was filtered and separated. The solvent in the filtrate was evaporated and exsiccaced and the obtained solid content was purified by performing recrystallization in chloroform/methanol-mixed solvent twice, to obtain 0.613 g (0.63 mmol) of objective Ir(MiPPy) (PrCOPPy)$_2$ as powder. Identification for it was performed by CHN and Ir elemental analysis and IR.

Example 2-2

Synthesis of the phosphorescent compound; {2-[3-(2-methacryloyloxyethyl)carbamoyloxyphenyl]pyridine}bis[2-(3-propionylphenyl)pyridine]iridium(III)/N-vinyl-carbazole copolymer (simplified as Ir(MiPPy) (PrCOPPy)$_2$/VCz copolymer below)

According to scheme (7), after 0.243 g (0.25 mmol) of Ir(MiPPy) (PrCOPPy)$_2$ complex synthesized in example 3, 0.918 g (4.75 mmol) of N-vinylcarbazole (VCz) (Ir(MiPPy) (PrCOPPy)$_2$ and VCz being in molar ratio of 5:95), 0.010 g (0.061 mmol) of 2,2'-azobis(isobutyronitrile) (AIBN), 10 ml of butyl acetate were put into a reactor and replacement with nitrogen was performed, reaction was performed for 10 hours at 80° C.

(7)

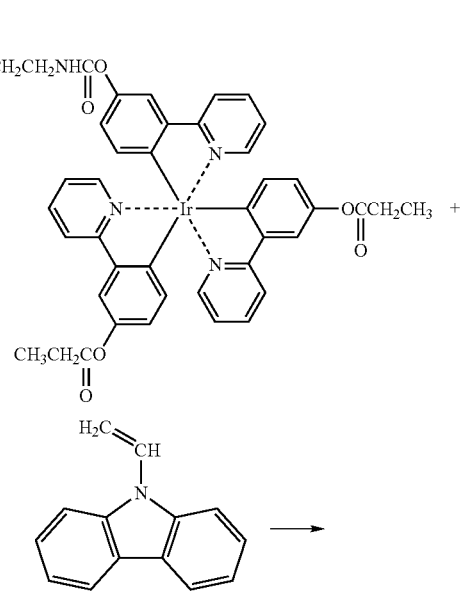

-continued

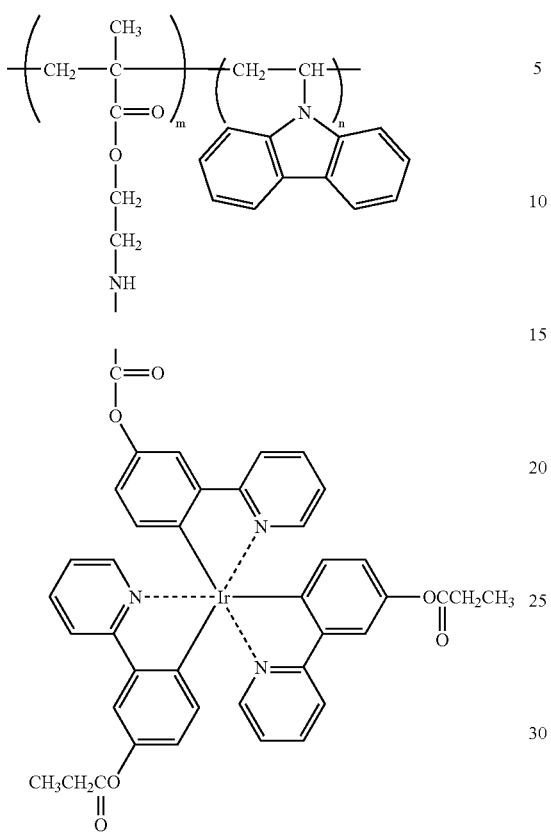

After the reaction, throwing into acetone for reprecipitation was performed and a copolymer was recovered by filtration. Throwing of a solution of the recovered copolymer in chloroform into methanol for reprecipitarion was further performed twice for purification and vacuum drying was performed after recovering the precipitation, to obtain 1.053 g of objective Ir(MiPPy) (PrCOPPy)$_2$/VCz copolymer as powder. CHN and Ir elemental analysis for the obtained copolymer supported that Ir(MiPPy) (PrCOPPy)$_2$ and VCz copolymerized in molar ratio of 5:95. That is, the repeating number m of the phosphorescent units/the repeating number of the carrier transporting units n=5/95 is considered. Also, from GPC for the copolymer in chloroform, weight-average molecular weight was 23000 relative to the polystyrene standard (an average degree of polymerizaion calculated from the weight-average molecular weight being 64). Furthermore, the phosphorescent compound according to the present invention is soluble in an organic solvent such as chloroform, etc.

Example 2-3

Fabrication of an Organic Light-emitting Device

A solution of Ir(MiPPy) (PrCOPPy)$_2$/VCz copolymer and tBu-PBD in chloroform was prepared. The proportion was 65 percent by weight for Ir(MiPPy) (PrCOPPy)$_2$/VCz copolymer to 35 percent by weight for tBu-PBD. This solution was spin-coated on a glass substrate with ITO to form a film with the thickness of 100 nm, and 10 nm of Ca and 100 nm of Al were deposited on it by a vacuum evaporation to provide a cathode. As a positive electrical voltage was applied on the ITO-side of this organic light-emitting device and a negative electrical voltage was applied on the Al-side, green luminescence originating from the iridium complex was observed. The quantum yield of the luminescence was approximately 3%.

Example 3-1

Synthesis of the phosphorescent compound; [2-(3-hexylphenyl)pyridine]bis(2-phenylpyridine)iridium(III)/3-hexylthiophene copolymer (simplified as Ir(HPPy)PPy$_2$/HT copolymer below)

As shown in scheme (8), 0.099 g (0.25 mmol) of 5-bromo-2-(4-bromo-3-hexylphenyl)pyridine (HPPyBr$_2$) and 1.549 g (4.75 mmol) of 3-hexyl-2,5-dibromothiophene (HTBr$_2$) ((HPPyBr$_2$) and (HTBr$_2$) being in molar ratio of 5:95) were copolymerized with Ni(COD)$_2$(0) catalyst (wherein COD represents a cyclooctadienyl group) in 10 ml of dimethylformamide (DMF) to synthesize 2-(3-hexylphenyl)pyridine/3-hexylthiophene copolymer (HPPy/HT copolymer) according to the usual method. Then, 0.625 g (4 mmol) of this HPPy/HT copolymer and 0.099 g (0.2 mmol) of Ir(acac)$_3$ were dissolved in metacresol and reaction was performed for 10 hours at 250° C. Furthermore, 0.062 g (0.4 mmol) of phenylpyridine was added into this solution and reaction was performed for 10 hours at 250° C.

(8)

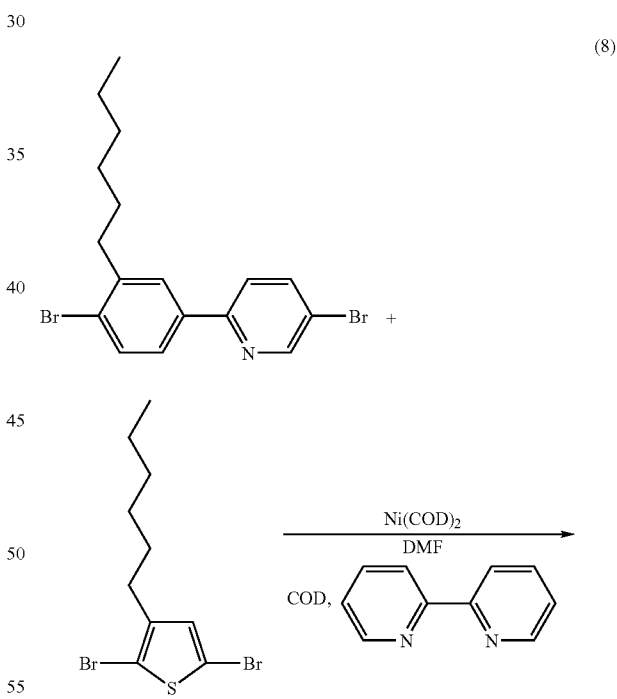

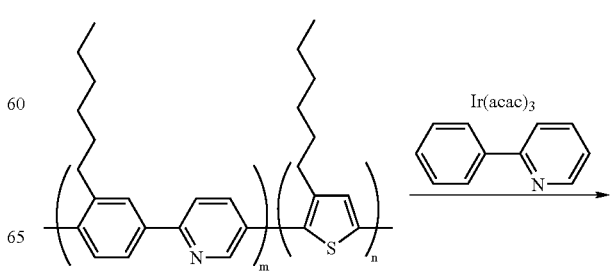

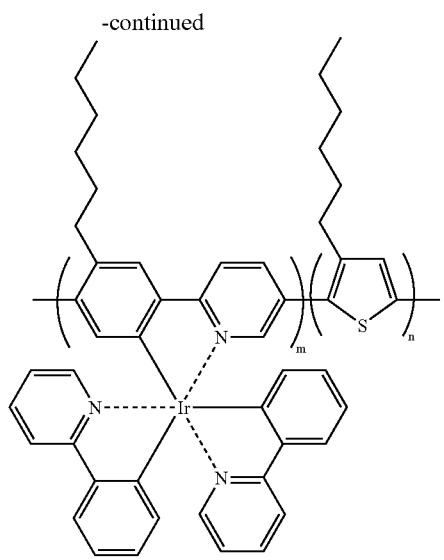

After the reaction, throwing into acetone for reprecipitation was performed and a copolymer was recovered by filtration. Throwing of a solution of the recovered copolymer in DMF into acetone for reprecipitazion was further performed twice for purification and vacuum drying was performed after recovering the precipitation, to obtain 0.564 g of objective Ir(HPPy)PPy$_2$/HT copolymer as powder.

CHN and Ir elemental analysis for the copolymer supported a supposed structure. That is, the repeating number m of the phosphorescent units/the repeating number of the carrier transporting units n=5/95 is considered. Also, from GPC for the copolymer in hexafluoroisopropanol, weight-average molecular weight was 18000 relative to the polystyrene standard (an average degree of polymerizaion calculated from the weight-average molecular weight being 68). Furthermore, the phosphorescent compound according to the present invention is soluble in an organic solvent such as DMF, etc.

Example 3-2

Fabrication of an Organic Light-emitting Device

A solution of Ir(HPPy)PPy$_2$/HT copolymer and tBu-PBD in chloroform was prepared. The proportion was 65 percent by weight for Ir(HPPy)PPy$_2$/HT copolymer to 35 percent by weight for tBu-PBD. This solution was spin-coated on a glass substrate with ITO to form a film with the thickness of 100 nm, and 10 nm of Ca and 100 nm of Al were deposited on it by a vacuum evaporation to provide a cathode. As a positive electrical voltage was applied on the ITO-side of this organic light-emitting device and a negative electrical voltage was applied on the Al-side, yellow luminescence originating from the iridium complex was observed. The quantum yield of the luminescence was approximately 1%.

Example 4-1

Synthesis of the monomer of the electron transporting compound; 2-(4-tert-butyl-phenyl)-(4'-vinyl-biphenyl-4-yl)-[1,3,4]oxadiazole (simplified as VPBD below)

VPBD was synthesized according to the method disclosed In Japanese Laid-Open Patent Application No. 10-1665.

Example 4-2

Synthesis of the phosphorescent compound; [2-(3-methacrylphenyl)pyridine]bis[2-(3-propionylphenyl) pyridine]iridium(III)/N-vinylcarbazole/2-(4-tert-butyl-phenyl)-5-(4'-vinyl-biphenyl-4-yl)-[1,3,4]oxadiazole copolymer (simplified as Ir(MPPy) (PrCOPPy)$_2$/VCz/ VPBD copolymer below)

According to scheme (9), after 0.222 g (0.25 mmol) of Ir(MPPy))$_2$ complex synthesized in example 1-1, 0.628 g (3.25 mmol) of VCz, 0.571 g (1.50 mmol) of VPBD synthesized in example 4-1 described above (the molar ratio being Ir(MPPy) (PrCOPPy)2: VCz: VPBD=5: 65:30), 0.010 g (0.061 mmol) of 2,2'-azobis(isobutyronitrile) (AIBN), and 10 ml of benzene were put into a reactor and replacement with nitrogen was performed, reaction was performed for 10 hours at 80° C.

After the reaction, the product was thrown into acetone, reprecipitation was performed, and a copolymer was recovered by filtration. Throwing of a solution of the recovered copolymer in chloroform into methanol for reprecipitation was further performed twice for purification and vacuum drying was performed after recovering the precipitation, to obtain 0.80 g of objective Ir(MPPy) (PrCOPPy)$_2$/VCz/ VPBD copolymer as powder.

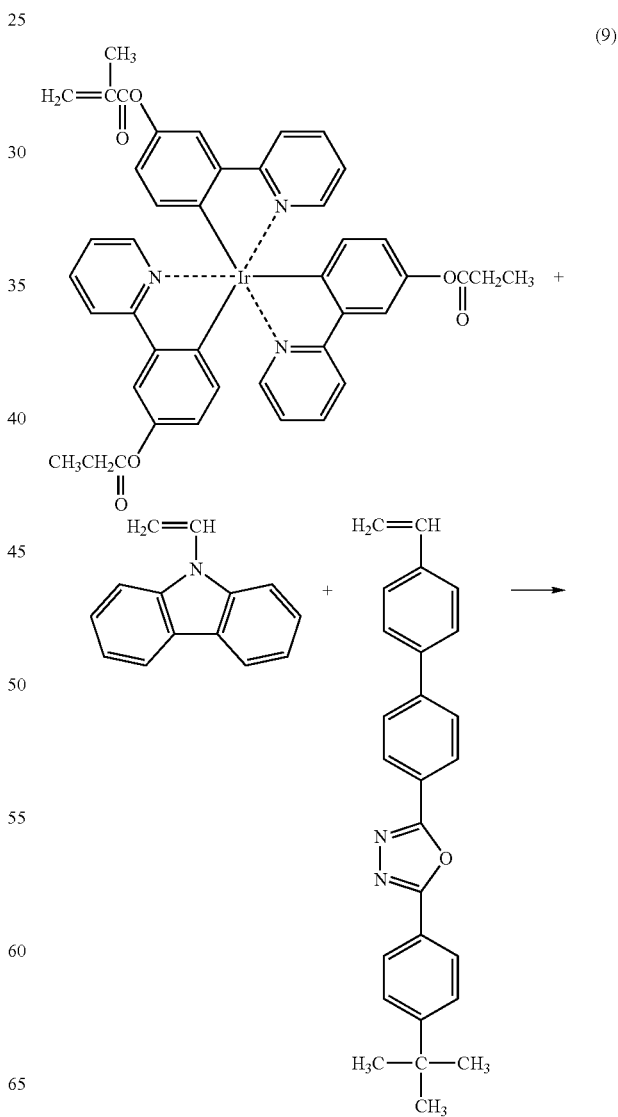

(9)

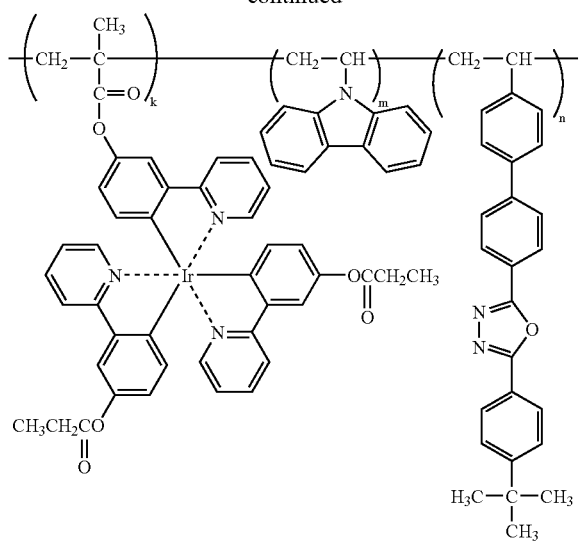

CHN and IR elemental analysis for the obtained copolymer (phosphorescent compound) supported that copolymerization was made in the molar ratio of Ir(MPPy) (PrCOPPy)2:VCz:VPBD=5:65:25. That is, (the repeating number of the phosphorescent units:k)/(the repeating number of the carrier transporting units m+n)=5/90 is considered. Also, from GPC for the copolymer in chloroform, weght-average molecular weight of the copolymer was 30000 relative to the polystyrene standard (an average degree of polymerization calculated from the weght-average molecular weight being 107). This copolymer is soluble in an organic solvent such as chloroform, etc.

Example 4-3

Fabrication of an Organic Light-emitting Device

A solution of Ir(MPPy) (PrCOPPy)2/VCz/VPBD copolymer obtained in example 4-2 in chloroform was prepared. This solution was spin-coated on a glass substrate with ITO to form a film with the thickness of 100 nm, and 10 nm of Ca and 100 nm of Al were deposited on it by a vacuum evaporation to provide a cathode so that an organic light-emitting device was obtained. As a positive electrical voltage was applied on the ITO-side of this organic light-emitting device and a negative electrical voltage was applied on the Al-side, green luminescence originating from the iridium complex was observed. The quantum yield of the luminescence was approximately 3%.

Example 5-1

Synthesis of the Electron Transporting Polymer Compound; Poly-VPBD (Simplified as PVPBD Below)

PVPBD was synthesized according to the method disclosed in Japanese Laid-Open Patent Application No. 10-1665.

Example 5-2

Fabrication of an Organic Light-emitting Device

A solution of Ir(MPPy) (PrCOPPy)2/VCz copolymer obtained in example 1-2 and PVPBD obtained in example 5-1 in chloroform was prepared. The proportion was 65 percent by weight for Ir(MPPy) (PrCOPPy)2/VCz copolymer to 35 percent by weight for PVPBD. This solution was spin-coated on a glass substrate with indium tin oxide (ITO) being a transparent electrode to form a film with the thickness of 100 nm, and 10 nm of Ca and 100 nm of Al were deposited on it by a vacuum evaporation to provide a cathode so that an organic light-emitting device was obatined. As an electrical voltage was applied wherein the ITO-side of this organic light-emitting device was at positive and the Al-side was at negative, green luminescence originating from the iridium complex was observed. The quantum yield of the luminescence was approximately 4.5%.

Example 6-1

Synthesis of the monomer having a blue phosphorescent site; iridium(III) bis(2-(2,4-difluorophenyl)pyridinato)(5-methacryloyloxymethylpicolinato) (simplified as Ir(2,4-F-ppy)2(5-CH2MA-pic) below)

As shown in scheme (10), iridium(III) bis(2-(2,4-difluorophenyl)pyridinato)(5-(hydroxymethyl)picolinato) (simplified as Ir(2,4-F-ppy)2(5-CH2OH-pic) below) was synthesized. That is, 10 ml of dried N,N-dimethylformamide was added to 121.6 mg (0.1 mmol) of [Ir(2,4-F-ppy)2Cl]2, 45.9 mg (0.3 mmol) of 5-hydroxymethylpicolinic acid, 106.0 mg (1.0 mmol) of sodium carbonate under argon gas stream and steering was performed for 2 hours at 80° C. After 50 ml of water was added into the reacted liquid, extraction with ethyl acetate was performed. After the solution was dried over magnesium sulfate; concentrated, and purified by means of column chromatography (silica gel, methanol:chloroform=1:19 (volume ratio)). Furthermore, it was recrystallized from hexane/chloroform to obtain 108.7 mg of Ir(2,4-F-ppy)2(5-CH2OH-pic) as a yellow crystal. Yield: 75%. Identification was performed by $^1$H-NMR and CHN elemental analysis. $^1$H-NMR (270 MHz, DMSO-d6), ppm: 8.54(d, 1H, J=4.6), 8.3–8.2(m, 2H), 8.1–8.0(m, 4H), 7.70(s, 1H), 7.61(d, 1H, J=4.9), 7.49(dd, 1H, J=6.6, .6.6), 7.32(dd, 1H, J 6.6, .6.6), 6.9–6.7(m, 2H), 5.71(dd, 1H, J=8.9, 2.4), 5.46(dd, 1H, J=8.5, 2.3), 5.42(t, 1H, J=4.6), 4.49(d, 2H, J=4.6). Anal. Found: C 48.05; H 2.54; N 5.86. Calcd: C 48.06; H 2.50; N 5.80.

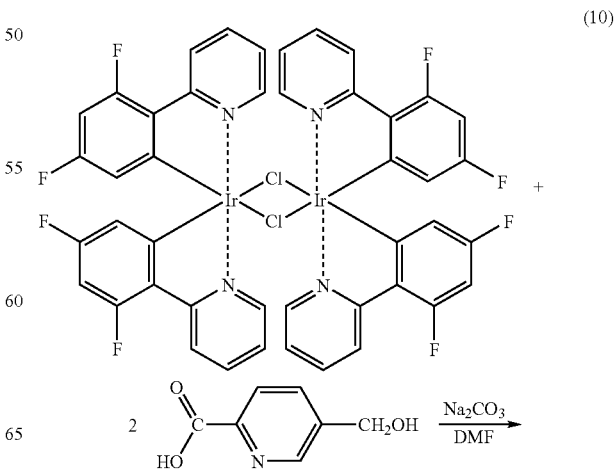

(10)

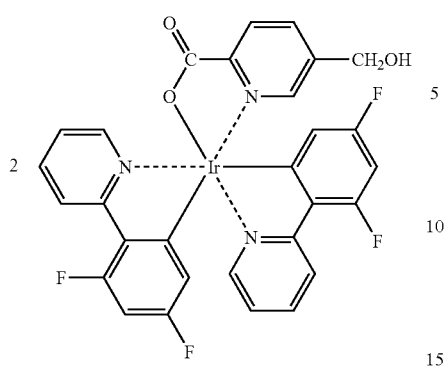

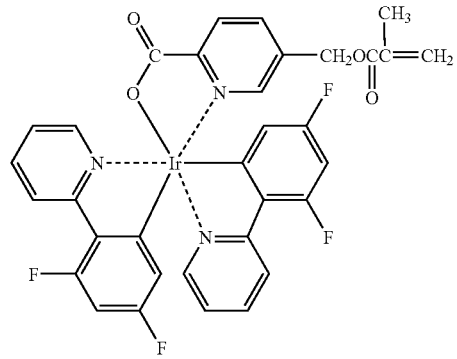

Subsequently, As shown in scheme (11), Ir(2,4-F-ppy)$_2$(5-CH$_2$MA-pic) was synthesized. That is, 72.5 mg (0.1 mmol) of Ir(2,4-F-ppy)$_2$(5-CH$_2$OH-pic) and 0.2 mg of 2,6-di-tert-4-methylphenol were dissolved into 10 ml of dried dichloromethane under argon gas stream, 101.2 mg (1.0 mmol) of triethylamine and 52.3 mg (0.5 mmol) of methacrylic acid chloride were added, and steering was performed for 2 hours at room temperature. 50 ml of water was added into the reacted liquid and extraction with chloroform was performed. After the solution was dried over magnesium sulfate, concentrated, and purified by means of column chromatography (silica gel, methanol:chloroform=3:97 (volume ratio)). Furthermore, it was recrystallized from hexane/chloroform to obtain 70.6 mg of Ir(2,4-F-ppy)$_2$(5-CH$_2$MA-pic) as a yellow crystal. Yield: 89%. Identification was performed by $^1$H-NMR and CHN elemental analysis. $^1$H-NMR(270 MHz, DMSO-d$_6$), ppm: 8.53(d, 1H, J=5.1), 8.28(d, 1H, J=8.4), 8.22(d, 1H, J=8.6), 8.1–8.0(m, 4H), 7.70(s, 1H), 7.66(d, 1H, J=4.9), 7.48(dd, 1H, J=6.5, .6.5), 7.31(dd, 1H, J=6.5, .6.5), 6.9–6.7(m, 2H), 5.84(s, 1H), 5.7–5.6(m, 2H), 5.47(dd, 1H, J=8.8, 2.6), 5.24(d, 2H, J=2.7), 1.78(s, 3H). Anal. Found: C 49.92; H 2.87; N 5.28. Calcd: C 50.00; H 2.80; N, 5.30.

(11)

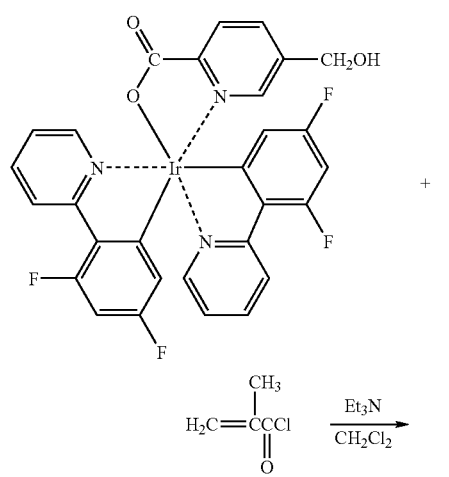

Example 6-2

Synthesis of the monomer having a green phosphorescent site; [6-(4-vinylphenyl)-2,4-hexanedionato]bis(2-phenylpyridine) iridium(III) (simplified as Ir(ppy)$_2$[1-(StMe)-acac] below)

As shown in scheme (12), acetylacetone and 4-vinylbenzylchloride were reacted to synthesize 6-(4-vinylphenyl)-2,4-hexanedione. That is, 1.23 g (60% in oil) (31 mmol) of sodium hydride was weighed under nitrogen atmosphere, 60 ml of dried tetrahydrofuran (simplified as THF below) was added to it and cooling was performed to 0° C. in an ice bath. As the mixed solution of 2.5 g (24 mmol) of acetylacetone and 1 ml of hexamethylphospholic triamide was dropped into this suspension, colorless precipitation was produced. After steering for 10 minutes at 0° C., as 17.5 ml (28 mmol) of a solution (1.6M) of n-butyl lithium in hexane was dropped, the precipitate was dissolved, and steering was further performed for 20 minutes at 0° C. 4.0 g (26 mmol) of 4-vinylbenzylchloride was dropped into the obtained pale yellow solution, and after the reacted liquid was returned to room temperature and steered for 20 minutes, diluted hydrochloric acid was added so as to render the water phase acidic. After the organic phase was washed with saturated sodium chloride aqueous solution and dried over magnesium sulfate, the solvent was evaporated by a rotary evaporator. The obtained reaction mixture was added into a silica gel column and developed with a mixed solvent of 1:1 (volume ratio) hexane/dichloromethane to fractionate a main product. The solvent was evaporated from the obtained solution under reduced pressure to obtain 3.0 g (14 mmol) of objective 6-(4-vinylphenyl)-2,4-hexanedione as brown liquid. Yield: 56%. Identification was performed by CHN elemental analysis and $^1$H-NMR. $^1$H-NMR (CDCl$_3$): enol; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.46 (s, 1H, diketonate-methine), 5.20 (d, J=11.1 Hz, 1H, vinylic), 2.91 (t, J=5.7 Hz, 2H, methylene), 2.58 (t, J=7.3 Hz, 2H, methylene), 2.03 (s, 3H, methyl). keto; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.20 (d, J=11.1 Hz, 1H, vinylic), 3.53 (s, 2H, C(=O)CH$_2$C(=O)), 2.89 (m, 4H, ethylene), 2.19 (s, 3H, methyl). enol: keto=6:1. E.A.:

Calcd for $C_{14}H_9O_2$: C, 77.75; H, 7.46. Found: C, 77.49; H, 7.52.

(12)

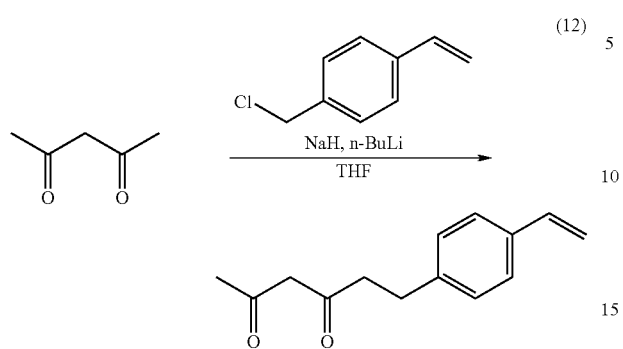

Subsequently, as shown in scheme (13), this 6-(4-vinylphenyl)-2,4-hexanedione and [Ir(ppy)$_2$Cl]$_2$ synthesized according to a usual method were reacted to (0.32 mmol) of [Ir(ppy)$_2$Cl]$_2$, 1.58 mg (1.5 mmol) of sodium carbonate, and 5 mg (0.023 mmol) of 2,6-di-tert-butyl-4-methylphenol were dissolved into 5 ml of N,N-dimethylformamide (simplified as DMF below), 210 mg (0.97 mmol) of 6-(4-vinylphenyl)-2,4-hexanedione was added into it, and steering with heating was performed for 1 hour at 65° C. Then, after diluted hydrochloric acid aqueous solution was added to the reacted solution cooled to room temperature, a pale yellow component was extracted with chloroform. After the solvent was evaporated using a rotary evaporator, the residue was dissolved into a small amount of dichloromethane to fractionate a yellow main product by means of silica gel column chromatography (developer: dichloromethane). This solution was exsiccated under reduced pressure, a dichloromethane-hexane mixed solution was added, and recrystallization was performed at −20° C., to obtain 354 mg (0.49 mmol) of objective Ir(ppy)$_2$[1-(Stme)-acac] as a pale yellow crystal. Yield: 78%. Identification was performed by CHN elemental analysis and $^1$H-NMR. $^1$H NMR (CDCl$_3$): δ 8.47 (d, J=5.7 Hz, 1H, ppy), 8.21 (d, J=5.7 Hz, 1H, ppy), 7.9–7.5 (m, 6H, ppy), 7.18 (d, J=8.1 Hz, 2H, stylyl-aromatic), 7.00 (m, 2H, ppy), 6.89 (d, J=8.1 Hz, 2H, stylyl-aromatic), 6.75 (m, 5H, ppy and vinylic), 6.28 (t, J=7.3 Hz, 2H, ppy), 7.67 (d, J=17.6 Hz, 1H, vinylic), 5.19 (d, J=9.5 Hz, 1H, vinylic), 5.17 (s, 1H, diketonate-methine), 2.60 (t, J=7.3 Hz, 2H, ethylene), 2.36 (m, 2H, ethylene), 1.75 (s, 3H, methyl). E.A.: Calcd for $C_{36}H_{31}IrN_2O_2$: C, 60.40; H, 4.36; N, 3.91. Found: C, 61.35; H, 4.34; N, 3.83.

(13)

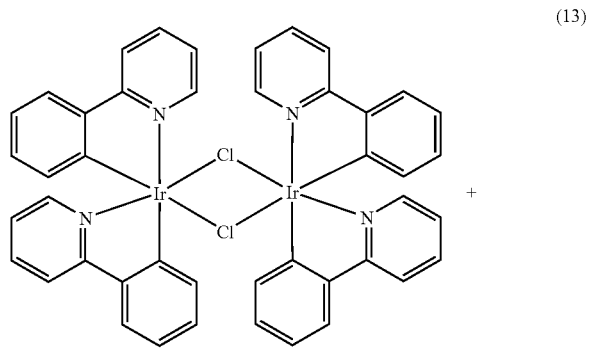

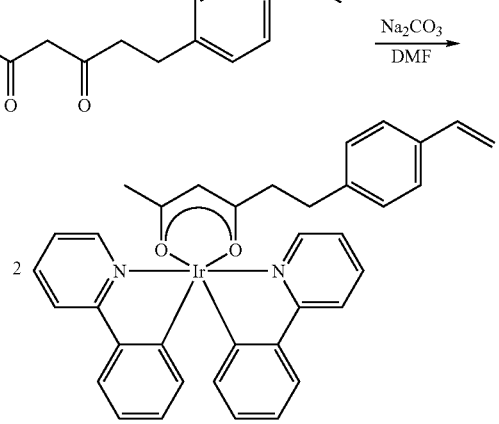

Example 6-3

Synthesis of the monomer having a red phosphorescent site; [6-(4-vinylphenyl)-2,4-hexanedionato]bis[2-(2-pyridyl)benzothienyl]iridium(III) {simplified as Ir(btp)$_2$[1-(StMe)-acac] below}

As shown in scheme (14), acetylacetone and 4-vinylbenzylchloride were reacted to synthesize 6-(4-vinylphenyl)-2,4-hexanedione. That is, 1.23 g (60% in oil) (31 mmol) of sodium hydride was weighed under nitrogen atmosphere, 60 ml of dried tetrahydrofuran (simplified as THF below) was added to it, and cooling was performed to 0° C. in an ice bath. As the mixed solution of 2.5 g (24 mmol) of acetylacetone and 1 ml of hexamethylphospholic triamide (simplified as HMPA below) was dropped into this suspension, colorless precipitation was produced. After steering for 10 minutes at 0° C., as 17.5 ml (28 mol) of a solution (1.6M) of n-butyl lithium in hexane was dropped, the precipitate was dissolved, and steering was further performed for 20 minutes at 0° C. 4.0 g (26 mmol) of 4-vinylbenzylchloride was dropped into the obtained pale yellow solution, and after the reacted liquid was returned to room temperature and steered for 20 minutes, diluted hydrochloric acid was added so as to render the water phase acidic. After the organic phase was washed with saturated sodium chloride aqueous solution and dried over magnesium sulfate, the solvent was evaporated by a rotary evaporator. The obtained reaction mixture was added into a silica gel column and developed with a mixed solvent of 1:1 (volume ratio) hexane/dichloromethane to fractionate a main product. The solvent was evaporated from the obtained solution under reduced pressure to obtain 3.0 g (14 mmol) of objective 6-(4-vinylphenyl)-2,4-hexanedione as brown liquid. Yield: 56%. Identification was performed by CHN elemental analysis and $^1$H-NMR. $^1$H NMR: enol; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.46 (s, 1H, enol-methine) 5.20 (d, J=11.1 Hz, 1H, vinylic), 2.91 (t, J=5.7 Hz, 2H, methylene), 2.58 (t, J=7.3 Hz, 2H, methylene), 2.03 (s, 3H, methyl). keto; δ 7.33 (d, J=8.1 Hz, 2H, aromatic), 7.14 (d, J=8.4 Hz, 2H, aromatic), 6.68 (dd, J=8.1 Hz, 1H, vinylic), 5.70 (d, J=17.0 Hz, 1H, vinylic), 5.20 (d, J=11.1 Hz, 1H, vinylic), 3.53 (s, 2H, C(=O)CH$_2$C (=O)), 2.89 (m, 4H, ethylene), 2.19 (s, 3H, methyl). enol:keto=6:1. E.A.: Calcd for $C_{14}H_9O_2$: C, 77.75; H, 7.46. Found: C, 77.49; H, 7.52.

(14)

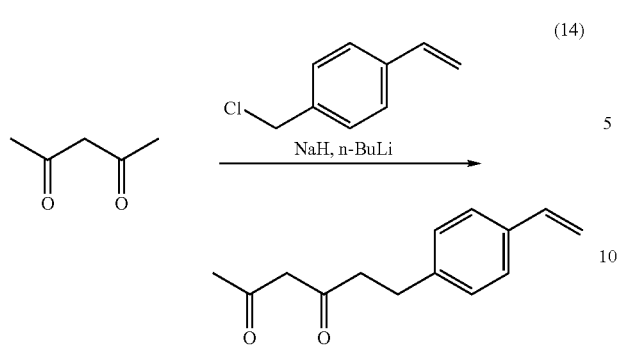

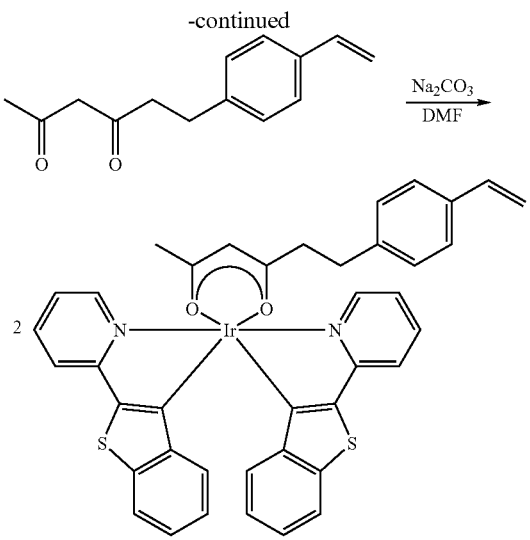

Example 6-4

Synthesis of White Phosphorescent Compound

Subsequently, as shown in scheme (15), this 6-(4-vinylphenyl)-2,4-hexanedione and di(μ-chloro)tetrakis(2-(2-pyridyl)benzothienyl)iridium (simplified as [Ir(btp)₂Cl]₂ below) synthesized according to a usual method (for example, described in S. Lamansky, et al., Inorganic Chemistry, 40, 1704 (2001)) were reacted to synthesize Ir(btp)₂]1-(St-Me)-acac]. That is, 253 mg (0.20 mmol) of [Ir(btp)₂Cl]₂ was suspended in 10 ml of N,N-dimethylformamide (simplified as DMF below), 161 mg (0.74 mmol) of 6-(4-vinylphenyl)-2,4-hexanedione, 64 mg of sodium carbonate, and 1.9 mg (0.0086 mmol) of 2,6-di-tert-butyl-4-methylphenol (simplified as BHT below) were added, and steering with heating was performed for 1 hour at 80° C. 100 ml of water and 50 ml of chloroform were added into the obtained reaction mixture and shaken well, and after the organic phase was dried over magnesium sulfate, exsiccation under reduced pressure was performed by a rotary evaporator. Then, the crude purified one was purified with dichloromethane as an eluate in a silica gel column to obtain a reddish brown solution. This solution was concentrated under reduced pressure, hexane was added, and recrystallization was performed at −20° C. to obtain 153 mg (0.18 mmol) of objective Ir(btp))₂[1-(StMe)-acac] as a reddish brown solid (yield: 47%). Identification was performed by CHN elemental analysis and ¹H-NMR.
¹H NMR: δ 8.40 (d, J=5.4 Hz, 1H, btp), 7.97 (d, J=5.4 Hz, 1H, btp), 7.65 (m, 6H, btp), 7.1–6.7 (m, 10H, aromatic), 6.63 (dd, J=17.8, 11.1 Hz, 1H, vinylic), 6.24 (d, J=8.1 Hz, 1H, btp), 6.16 (d, J=7.8 Hz, 1H, btp)), 5.65 (d, J=17.8 Hz, 1H, vinylic), 5.22 (s, 1H, diketonate-methine), 5.18 (d, J=11.1 Hz, 1H, vinylic), 2.56 (m, 2H, ethylene), 2.37 (m, 2H, ethylene), 1.75 (s, 3H, methyl). E.A.: Calcd for $C_{40}H_{31}IrN_2O_2S_2$: C, 58.02; H, 3.77; N, 3.38. Found: C, 57.79; H, 3.81; N. 3.55.

A copolymer containing three kinds of monomers having emission function synthesized in examples 6-1 to 6-3 and N-vinylcarbazole having hole transporting function was synthesized.

1.55 g (8.0 mmol) of N-vinylcarbazole, 58.0 mg (0.08 mmol) of Ir(2,4-F-ppy)₂(3-ST-pic), 1.1 mg (0.0015 mmol) of Ir(ppy)₂[1-(ST-Me)-acac], 1.2 mg (0.0015 mmol) of Ir(btp)₂[1-(StMe)-acac], and 13 mg (0.08 mmol) of AIBN were dissolved into 40 ml of dried toluene and argon was further insufflated for 1 hour. The temperature of this solution was elevated to 80° C., polymerization reaction was initiated, and steering was performed for 8 hours as it stood. After cooling down, the reacted liquid was dropped, into 250 ml of methanol and a polymer was precipitated and recovered by filtration. Furthermore, after purification by dissolving the recovered polymer into 25 ml of chloroform and dropping this solution into 250 ml of methanol to reprecipitate, vacuum drying was performed for 12 hours at 60° C. to obtain 116.3 mg of the objective white phosphorescent compound having three kinds of phosphorescent sites radiating in blue, green, and red colors.

From the result of Ir elemental analysis for the obtained copolymer (phosphorescent compound), the content of Ir complex (phosphorescent unit) was 1.07 mol %. Also, from GPC for the copolymer in chloroform, weight-average molecular weight was 12400 relative to the polystyrene standard.

Example 6-5

Fabrication of an Organic Light-emitting Device

An organic light-emitting device was fabricated as similar to example 1-3 except using the copolymer synthesized in example 6-2 instead of Ir(MPPy) (PrCOPPy)₂/VCz copolymer.

As a positive electrical voltage was applied on the ITO-side of this organic light-emitting device and a negative electrical voltage was applied on the Al-side, white luminescence was observed with the naked eye.

Figure 3:
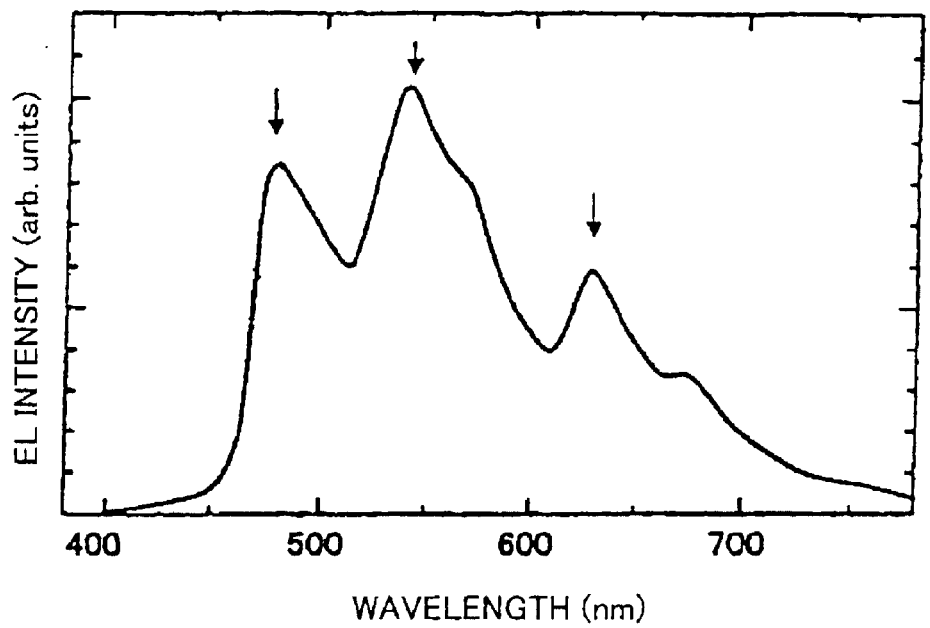
FIG. 3 is a diagram showing an emission spectrum of the organic light-emitting device fabricated in example 6-3.

An emission spectrum for the organic light-emitting device is shown in FIG. 3. Peaks of emission corresponding to three kinds of phosphorescent units (blue, green, and red) were observed at 480 nm, 520 nm, and 620 nm, respectively. The chromaticity of the luminescence color was (0.32, 0.33).

(15)

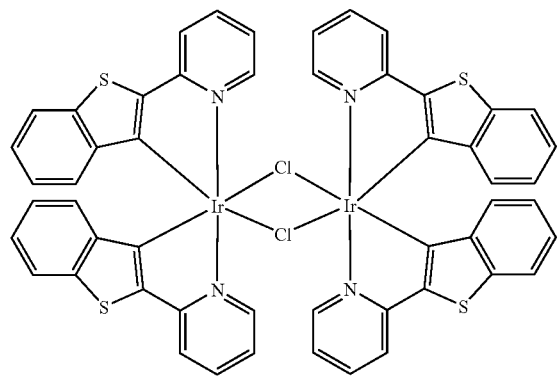

Example 7-1

Synthesis of the monomer having a blue phosphorescent site; iridium(III) bis(2-(2,4-difluorophenyl)pyridinato)(3-(4-vinylphenyl)methoxypicolinato) (simplified as Ir(2,4-F-ppy)$_2$(3-ST-pic) below)

As shown in scheme (16), 2-(2,4-difluorophenyl)pyridine was synthesized. That is, 8.69 g (55.0 mmol) of 2-brormopyridine was dissolved into 200 ml of dried tetrahydrofuran under argon gas stream, cooling was performed to −78° C., 38.7 ml (61.9 mmol) of a 1.6M solution of n-butyl lithium in hexane was dropped for 30 minutes. After dropping, a solution in which 7.5 g (55.0 mmol) of zinc chloride was dissolved into 50 ml of dried tetrahydrofuran (THF) was further dropped for 30 minutes. After dropping, temperature was elevated to 0° C. slowly, 9.65 g (55.0 mmol) of 1-bromo-2,4-difluorobenzene and 2.31 g (2.0 mmol) of tetrakis(triphenylphosphine) palladium (0) were added, and after steering was performed for 6 hours under reflux, 200 ml of saturated saline solution was added into the reacted liquid and extraction was performed with diethyl ether. After the extracted liquid was dried, concentrated, and purified by means of column chromatography (silica gel; chloroform:hexane=1:1 (volume ratio)) to obtain 2-(2,4-difluorophenyl)pyridine as colorless transparent oil. Yield: 6.00 g. Yield: 63%. Identification was performed by $^1$H-NMR and CHN elemental analysis. $^1$H-NMR (270 MHz, CDCl$_3$), ppm: 8.71(d, 1H, J=4.6 Hz), 8.00 (td, 1H, J=8.9, 6.5 Hz), 7.8–7.7 (m, 2H), 7.3–7.2(over wrapped with CHCl$_3$, 1H), 7.1–6.8 (m, 2H) Anal. Found: C 68.98; H 3.80; N, 7.31. Calcd: C 69.11; H 3.69; N 7.33.

(16)

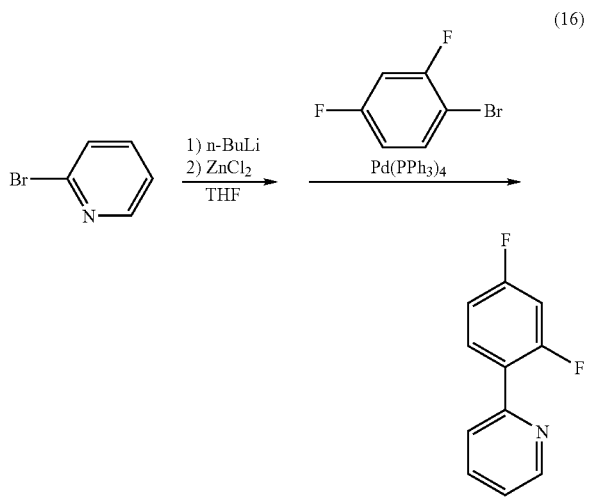

Subsequently, as shown in scheme (17), a binuclear complex of iridium, i.e. bis(μ-chloro)tetrakis(2-(2,4-difluorophenyl)pyridine) diiridium(III) (simplified as [Ir(2,4-F-ppy)$_2$Cl]$_2$ below) was synthesized. That is, 0.96 g (5.0 mmol) of 2-(2,4-difluorophenyl)pyridine and 1.00 g of sodium hexachloroiridiumate(III) n-hydrates (produced by Wako Pure Chemical Industries, Ltd.) were dissolved into 40 ml of a mixed solvent of 2-ethoxyethanol:water=3:1, and after argon was insufflated for 30 minutes, steering was performed for 5 hours under reflux. The produced precipitate was filtered, washed with ethanol and a small amount of acetone, and dried for 5 hours under vacuum, to obtain [Ir(2,4-F-ppy)$_2$Cl]$_2$ as yellow powder. Yield: 0.79 g Yield: 86%. Identification was performed by $^1$H-NMR and CHN elemental analysis. $^1$H-NMR(270 MHz, CDCl$_3$), ppm: 9.12 (d, 4H, J=5.7 Hz), 8.31(d, 4H, J=8.6 Hz), 7.83(dd, J=7.6, 7.6 Hz), 6.82(dd, 4H, J=7.3, 7.3 Hz), 6.34(ddd, 4H, J=11.6, 10.0, 2.4 Hz), 5.29(dd, 4H, J=9.5, 2.4 Hz). Anal. Found: C 43.69; H 3.53; N 3.54. Calcd: C 43.88; H 3.45; N 3.56.

(17)

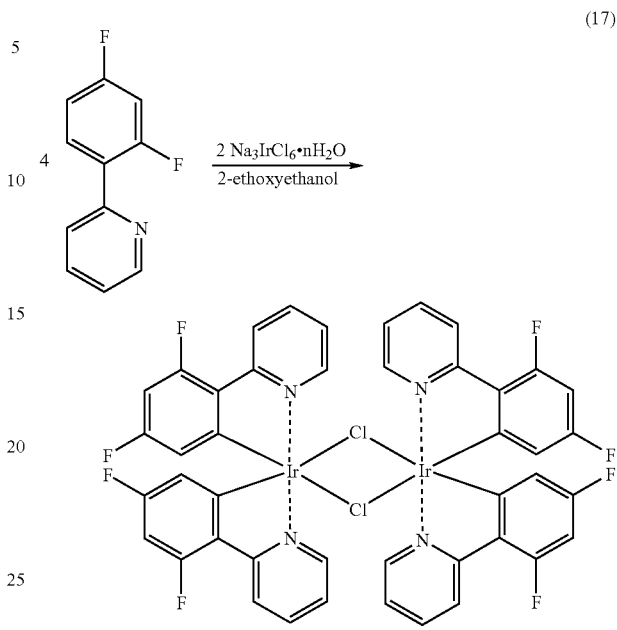

Subsequently, as shown in scheme (18), iridium(III) bis (2-(2,4-difluorophenyl)pyridinato)(3-hydroxypicolinato) (simplified as Ir(2,4-F-ppy)$_2$(3-OH-pic) below) was synthesized. That is, 10 ml of dried N,N-dimethylformamide (DMF) was added to 121.6 mg (0.1 mmol) of [Ir(2,4-F-ppy)$_2$Cl]$_2$, 41.7 mg (0.3 mmol) of 3-hydroxypicolinic acid, 106.0 mg (1.0 mmol) of sodium carbonate under argon gas stream and steering was performed for 2 hours at 80° C. After 50 ml of water was added into the reacted liquid, extraction with ethyl acetate was performed. After the solution was dried over magnesium sulfate, concentrated, and purified by means of column chromatography (silica gel, methanol:chloroform 3:97 (volume ratio)). Furthermore, it was recrystallized from hexane/chloroform to obtain 101.0 mg of Ir(2,4-F-ppy)$_2$(3-OH-pic) as a yellow crystal. Yield: 71%. Identification was performed by $^1$H-NMR and CHN elemental analysis. $^1$H-NMR(270 MHz, DMSO-d$_6$), ppm: 13.6(br, 1H), 8.50(d, 1H, J=5.9 Hz), 8.25(d, 2H, J=11.1 Hz), 8.1–8.0 (m, 2H), 7.69(d, 1H, J=5.7 Hz), 7.62(d, 1H, J=8.1 Hz), 7.53(d, 1H, J=4.6 Hz), 7.50(d, 1H, J=5.7 Hz), 7.36(t, 1H, J=4.5 Hz), 7.24(d, 1 H, J=5.1 Hz), 6.9–6.7(m, 2H), 5.66(dd, 1H, J=8.6, 2.4 Hz), 5.48(dd, 1H, J=8.6, 2.4 Hz). Anal. Found: C 47.29; H 2.33; N 5.86. Calcd: C 47.32; H 2.27; N 5.91.

(18)

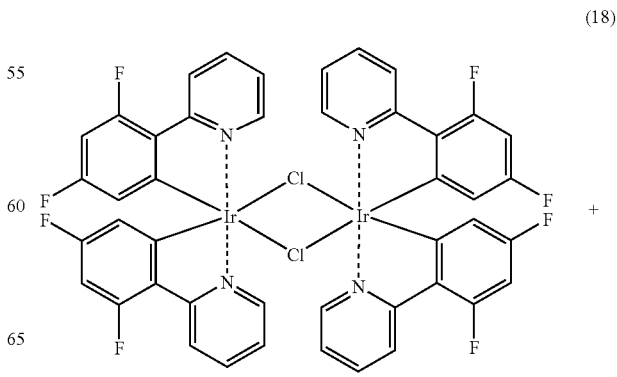

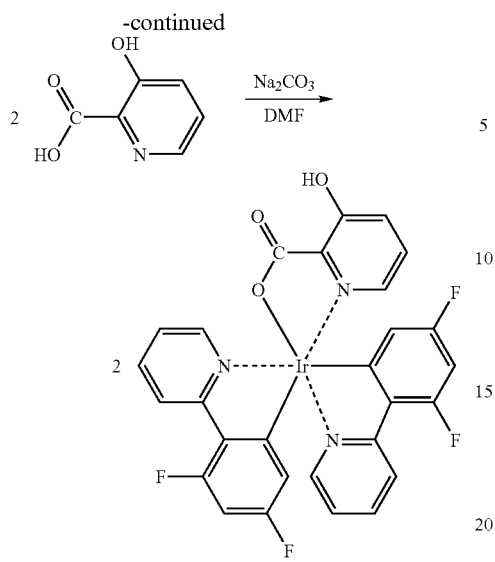

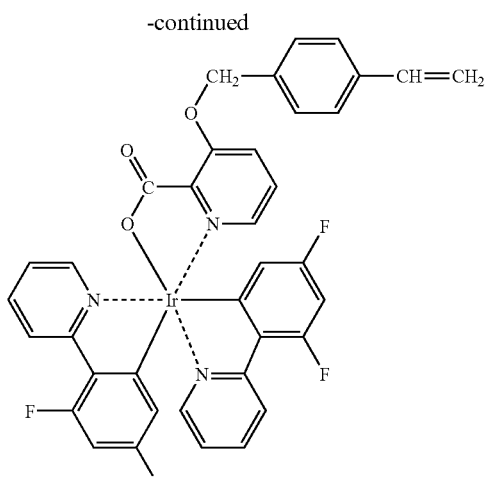

Subsequently, As shown in scheme (19), Ir(2,4-F-ppy)$_2$ (3-ST-pic) was synthesized. That is, 15 ml of dried N,N-dimethylformamide was added to 106.5 mg (0.15 mmol) of Ir(2,4-F-ppy)$_2$(3-OH-pic), 207.3 mg (1.5 mmol) of potassium carbonate, and 0.3 mg of 2,6-di-t-butylhydroxytoluene under argon gas stream, 91.5 mg (0.6 mmol) of 4-vinylbenzylchloride was further added, and steering was performed for 4 hours at 80° C. 10 ml of water was added into the reacted liquid, and a product was precipitated, filtrated, and purified by means of column chromatography (silica gel, methanol:chloroform=3:97 (volume ratio)). Furthermore, it was recrystallized from hexane/chloroform to obtain 72.0 mg of Ir(2,4-F-ppy)$_2$(3-St-pic) as a yellow crystal. Yield: 58%. Identification was performed by $^1$H-NMR and CHN elemental analysis. $^1$H-NMR(270 MHz, DMSO-d$_6$), ppm: 8.59(d, 1H, J=5.1 Hz), 8.3–8.2 (m, 2H), 8.1–8.0(m, 2H), 7.9(d, 1H, J=8.6 Hz), 7.67(d, 1H, J=5.1 Hz), 7.6–7.3(m, 7H), 6.9–6.7(m, 3H), 5.85(d, 1H, J=17.8 Hz), 5.67(dd, 1H, J=8.9, 2.4 Hz), 5.45(dd, 1H, J=8.9, 2.4 Hz), 5.29(s, 2H), 5.27(d, 1H, J=11.1 Hz). Anal. Found: C 53.71; H 2.90; N 5.03. Calcd: C 53.75; H 2.93; N 5.08.

(19)

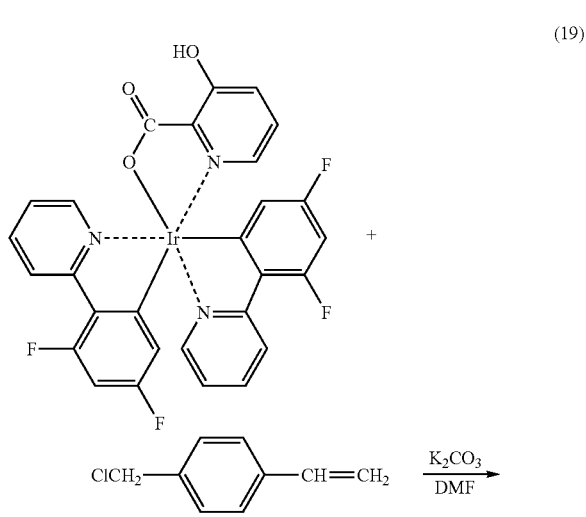

Example 7-2

Synthesis of copolymer of Ir(2,4-F-ppy)$_2$(3-ST-pic) having a blue phosphorescent site and vinylcarbazole having a hole transporting function (simplified as Ir(2,4-ppy)$_2$(3-ST-pic)/VCz copolymer below)

966 mg (5.0 mmol) of N-vinylcarbazole, 41(0.05 mmol) of Ir(2,4-F-ppy)$_2$(3-ST-pic) synthesized in example 7-1, and 8.2 mg (0.05 mmol) of AIBN were dissolved into 25 ml of dried toluene and argon was further insufflated for 1 hour. The temperature of this solution was elevated to 80° C., polymerization reaction was initiated, and steering was performed for 8 hours as it stood. After cooling down, the reacted liquid was dropped into 250 ml of methanol and a polymer was precipitated and recovered by filtration. Furthermore, after purification by dissolving the recovered polymer into 25 ml of chloroform and dropping this solution into 250 ml of methanol to reprecipitate, vacuum drying was performed for 12 hours at 60° C. to obtain 722 mg of the objective Ir(2,4-F-ppy)$_2$(3-ST-pic)/VCz copolymer.

From the result of Ir elemental analysis for the obtained copolymer (phosphorescent compound), the content of Ir complex (phosphorescent unit) was 1.04 mol %. Also, from GPC for the copolymer in chloroform, weight-average molecular weight was 11400 relative to the polystyrene standard.

Example 7-3

Synthesis of copolymer of [6-(4-vinylphenyl)-2,4-hexanedionato]bis[2-(2-pyridyl)benzothienyl]iridium(III) having a red phosphorescent site and vinylcarbazole having a hole transporting function (simplified as Ir(btp)$_2$[1-(STMe)-acac]/VCz copolymer below)

1.55 g (8.0 mmol) of N-vinylcarbazole, 33.1 mg (0.04 mmol) of Ir(btp)$_2$[1-(STMe)-acac] synthesized in example 6-3, and 13 mg (0.08 mmol) of AIBN were dissolved into 40 ml of dried toluene and argon was further insufflated for 1 hour. The temperature of this solution was elevated to 80° C., polymerization reaction was initiated, and steering was performed for 8 hours as it stood. After cooling down, the reacted liquid was dropped into 250 ml of methanol and a polymer was precipitated and recovered by filtration. Furthermore, after purification by dissolving the recovered polymer into 25 ml of chloroform and dropping this solution into 250 ml of methanol to reprecipitate, vacuum drying was performed for 12 hours at 60° C. to obtain 1.12 g of the objective Ir(btp)$_2$[1-(STMe)-acac]/VCz copolymer.

From the result of Ir elemental analysis for the obtained copolymer (phosphorescent compound), the content of Ir complex (phosphorescent unit) was 0.59 mol %. Also, from GPC for the copolymer in chloroform, weight-average molecular weight was 10800 relative to the polystyrene standard.

Example 7-4

Fabrication of an Organic Light-emitting Device

A solution of Ir(2,4-F-ppy)$_2$(3-ST-pic)/VCz coplymer synthesized in example 7-2, Ir(btp)$_2$[1-(STMe)-acac]/VCz copolymer synthesized in example 7-3, and tBu-PBD in chloroform was prepared. The proportions were 66.85 percent by mass for Ir(2,4-F-ppy)$_2$(3-ST-pic)/VCz coplymer, 3.15 percent by mass for Tr(btp)$_2$[1-(STMe)-acac]/VCz copolymer, and 30.0 percent by mass for tBu-PBD.

This solution was spin-coated on a glass substrate with ITO to form a film with the thickness of 100 nm, and 10 nm of Ca and 100 nm of Al were deposited on it by a vacuum evaporation to provide a cathode.

As a positive electrical voltage was applied on the ITO-side of the obtained organic light-emitting device and a negative electrical voltage was applied on the Al-side, white luminescence was observed with the naked eye.

Figure 4:
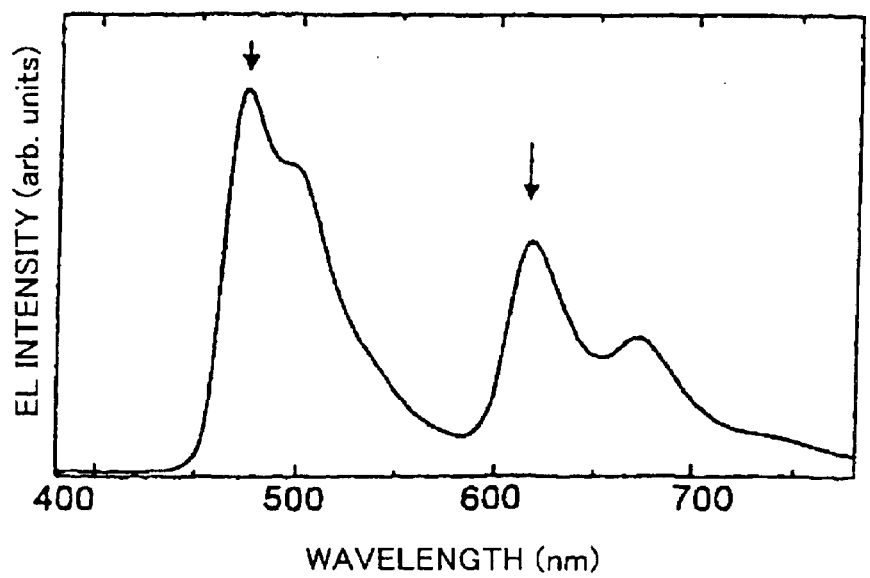
FIG. 4 is a diagram showing an emission spectrum of the organic light-emitting device fabricated in example 7-2.

An emission spectrum for the organic light-emitting device is shown in FIG. 4. Peaks of emission corresponding to Ir(2,4-F-ppy)$_2$(3-ST-pic)/VCz coplymer and Ir(btp)$_2$[1-(STMe)-acac]/VCz copolymer were observed at near 480 nm and near 620 nm, respectively. The chromaticity of the luminescence color was (0.30, 0.35).

What is claimed is:

1. A neutral organic polymeric phosphorescent compound which is obtainable by means of radical copolymerization of vinyl compounds, comprising:
    at least one phosphorescent unit being a repeat unit for emitting phosphorescence and
    at least one carrier transportation unit being a repeat unit for transporting a carrier, wherein
    both a phosphorescent site of the phosphorescent unit and a carrier transportation site of the carrier transportation unit constitute side chains,
    the carrier transportation unit is selected from the group consisting of a hole transportation unit being a repeat unit for transporting a hole and an electron transportation unit being a repeat unit for transporting an electron, and
    the hole transportation unit comprises a hole transportation site being a group of a compound selected from the group consisting of triphenylamine and triphenylamine derivatives, triophene derivatives, benzene derivatives, styrene derivatives, and fluorene derivatives.

2. The phosphorescent compound as claimed in claim 1, wherein a repeat number m for the phosphorescent unit(s) and a repeat number n for the carrier transportation unit(s) satisfy a relationship of m<n.

3. The phosphorescent compound as claimed in claim 2, wherein the repeat number m for the phosphorescent unit(s) and the repeat number for the carrier transportation unit(s) satisfy a relationship of $0.0001 \leq m/(m+n) \leq 0.2$, where m is at least 1 and n is at least 4.

4. The phosphorescent compound as claimed in claim 1, being soluble in an organic solvent or water.

5. The phosphorescent compound as claimed in claim 1, wherein a degree of polymerization is 5 through 5000.

6. The phosphorescent compound as claimed in claim 1, wherein the carrier transportation unit is the electron transportation unit.

7. The phosphorescent compound as claimed in claim 1, wherein the carrier transportation units comprise both the electron transportation unit and the hole transportation unit.

8. The phosphorescent compound as claimed in claim 1, wherein the carrier transportation unit is a hole transportation unit comprising a hole transportation site being a group of a compound selected from the group consisting of triphenylamine and triphenylamine derivatives.

9. The phosphorescent compound as claimed in claim 1, wherein a phosphorescent site of the phosphorescent unit is a monovalent group of a complex with a transition metal or a rare earth metal.

10. The phosphorescent compound as claimed in claim 9, wherein
    the phosphorescent site is a monovalent group of a complex with a transition metal or a rare earth metal, as a side chain,
    the monovalent group bonds to a main chain through a spacer portion, and
    the spacer portion is an organic group comprising 1 through 30 carbon atoms and a hetero atom or an inorganic group comprising 1 through 10 hetero atoms and no carbon atom.

11. The phosphorescent compound as claimed in claim 1, wherein the carrier transportation unit comprises an electron transportation site being a group of a compound selected from the group consisting of imidazole derivatives, triazole derivatives, and oxadiazole derivatives.

12. The phosphorescent compound as claimed in claim 1, wherein the phosphorescent unit is one of a kind of phosphorescent unit for emitting phosphorescence with one color.

13. The phosphorescent compound as claimed in claim 1, wherein the phosphorescent units are more than one kind of phosphorscent units for emitting phosphorescence with more than one colors different from each other.

14. The phosphorescent compound as claimed in claim 13, wherein the phosrescent units comprise a phosphorescent unit for emitting blue or green phosphorescence and a phosphorescent unit for emitting yellow or red phosphorescence and said phosphorescent compound can emit white light.

15. The phosphorescent compound as claimed in claim 1, wherein the phosphorescent units comprise three kinds of phosphorescent units for emitting blue, green, and red phosphorescence, respectively, and said phosphorescent compound can emit while light.

16. A phosphorescent composition, comprising the neutral organic polymeric phosphorescent compound as claimed in claim 1.

17. The phosphorescent composition as claimed in claim 16, wherein one or more kinds of the phosphorescent compounds having phosphorescent units for emitting phosphorescence with colors different from each other are compounded.

18. The phosphorescent composition as claimed in claim 17, capable of emitting white light.

19. The phosphorescent composition as claimed in claim 18, wherein the phosphorescent compound having a phosphorescent unit for emitting blue or green phosphorescence and the phosphorescent compound having a phosphorescent unit for emitting yellow or red phosphorescence are compounded.

20. The phosphorescent composition as claimed in claim 16, further comprising a polymeric or low molecular weight carrier transportation compound.

21. The phosphorscent composition as claimed in claim 20, wherein the polymeric or low molecular weight carrier transportation compound is a hole transportation compound.

22. The phosphorescent composition as claimed in claim 20, wherein the polymeric or low molecular weight carrier transportation compound is an electron transportation compound.

23. An organic light-emitting device having at least one organic polymer layer provided between an anode and a cathode, wherein said at least one organic polymer layer comprises the phosphorescent compound as claimed in claim 1.

24. The organic light-emitting device is claimed in claim 23, further comprising a transparent substrate on which the anode is provided and a color filter provided between the anode and the substrate.

25. The organic light-emitting device as claimed in claim 23, wherein the transparent substrate is made of a plastic material.

26. The organic light-emitting device as claimed in claim 23, wherein said at least one organic polymer layer is formed by an ink-jet method or a printing method.

27. A display apparatus having a display screen, wherein each pixel of the display screen comprises the organic light-emitting device as claimed in claim 23 and two or more transistors.

* * * * *